US006987484B2

(12) United States Patent
Von Klitzing et al.

(10) Patent No.: US 6,987,484 B2
(45) Date of Patent: Jan. 17, 2006

(54) DETECTOR FOR ELECTROMAGNETIC RADIATION AND A METHOD OF DETECTING ELECTROMAGNETIC RADIATION

(75) Inventors: Klaus Von Klitzing, Stuttgart (DE); Sergey Anatolievich Mikhailov, Stuttgart (DE); Jurgen Hubert Irma Smet, Stuttgart (DE); Igor Vladimirovich Kukushkin, Chernogolovka (RU)

(73) Assignee: Max-Planck-gesellschaft zur Forderung der Wissenschaften E.V., Munich (DE)

( * ) Notice: Subject to any disclaimer, the term of this patent is extended or adjusted under 35 U.S.C. 154(b) by 117 days.

(21) Appl. No.: 10/704,379

(22) Filed: Nov. 7, 2003

(65) Prior Publication Data

US 2005/0099345 A1 May 12, 2005

(51) Int. Cl.
*H01Q 1/26* (2006.01)

(52) U.S. Cl. ......................... 343/701; 343/703; 257/21; 257/194

(58) Field of Classification Search ................. 343/701, 343/703, 854; 257/21, 192, 194, 195; 324/158.1
See application file for complete search history.

(56) References Cited

U.S. PATENT DOCUMENTS

| 4,353,070 A | | 10/1982 | Pyee ........................... 343/701 |
| 4,399,442 A | * | 8/1983 | DeSantis et al. ............. 342/368 |
| 4,940,898 A | * | 7/1990 | Mahan ..................... 250/338.4 |
| 5,332,911 A | * | 7/1994 | von Klitzing et al. ....... 257/187 |
| 5,459,343 A | * | 10/1995 | Seymour et al. ............. 257/275 |
| 5,488,382 A | * | 1/1996 | Fenzi et al. ............. 343/700 R |
| 5,914,497 A | | 6/1999 | Sherwin ....................... 257/21 |
| 6,476,596 B1 | | 11/2002 | Wraback et al. ......... 324/158.1 |

OTHER PUBLICATIONS

S.G. Matsik, et al, *Cutoff Tailorability of Heterojunction Tetrahertz Detectors*, Applied Physics Letters, vol. 82, No. 1, pp. 139–141, Jan. 6, 2003.
M. Dyakonov, et al., *Plasma Wave Electronics for Terahertz Applications*, Terahertz Sources and Systems, pp. 187–207.
M. Dyakonov, et al., *Detection, Mixing, and Frequency Multiplication of Terahertz Radiation by Two-Dimensional Electronic Fluid*, IEEE Transactions on Electron Devices, vol. 43, No. 3, pp. 380–387, Mar. 1996.
W. Knap, et al., *Resonant Detection of Subterahertz Radiation by Plasma Waves in a Submicron Field-Effect Transistor*, Applied Physics Letters, vol. 80, No. 18, pp. 3433–3435, May 6, 2002.

(Continued)

*Primary Examiner*—Tho Phan
(74) *Attorney, Agent, or Firm*—Sierra Patent Group, Ltd.

(57) ABSTRACT

A detector for detecting electromagnetic radiation, especially for electromagnetic radiation in the GHz or THz range. The detector comprises a semiconductor structure having a 2D charge carrier layer or a quasi 2D charge carrier layer with an edge, at least first and second contacts to said charge carrier layer, said contacts being provided at said edge and being spaced apart by a distance, and a device for measuring at least one of the photocurrent between said first and second contacts, the photovoltage between said first and second contacts and the resistance between said first and second contacts. A device is provided for applying a magnetic field to said detector with a field component perpendicular to said charge carrier layer. An output signal of said measuring device provides information about at least one of the presence of electromagnetic radiation, the intensity of the incident electromagnetic radiation and the frequency of the incident electromagnetic radiation.

49 Claims, 25 Drawing Sheets

OTHER PUBLICATIONS

W. Knap, et al., *Resonant Detection of Subterahertz and Terahertz Radiation by Plasma Waves in Submicron Field-Effect Transistors,* Applied Physics Letters, vol. 81, No. 24, pp. 4637–4639, Dec. 9, 2002.

X.G. Peralta, et al., *Terahertz Photoconductivity and Plasmon Modes in Double-Quantum-Well Field-Effect Transistors,* Applied Physics Letters, vol. 81, No. 9, pp. 1627–1629, Aug. 26, 2002.

W. Knap, et al., *Nonresonant Detection of Terahertz Radiation in Field Effect Transistors,* Journal of Applied Physics, vol. 91, No. 11, pp. 9346–9353, Jun. 1, 2002.

P.J.M. Peters, et al., *Observation of Audio-Frequency Edge Magnetoplasmons in the Classical Two-Dimensional Electron Gas,* Physical Review Letters, vol. 67, No. 16, pp. 2199–2202, Oct. 14, 1991.

V.A. Volkov, et al., *Edge Magnetoplasmons: Low Frequency Weakly Damped Excitations in Inhomogeneous Two-Dimensional Electron Systems,* Sov. Phys. JETP 67 (8), pp. 1639–1653, Aug. 1988.

V.A. Volkov, et al., *Electrodynamics of Two-Dimensional Electron Systems in High Magnetic Fields,* Institute of Radioengineering and Electronics, Chapter 15, pp. 855–907, 1991.

Alexander L. Fetter, *Edge Magnetoplasmons in a Bounded Two-Dimensional Electron Fluid,* Physical Review B, vol. 32, No. 12, pp. 7676–7684, Dec. 15, 1985.

S.A. Mikhailov, *Edge Excitations of Low-Dimensional Charged Systems,* Horizons in World Physics, vol. 236, pp. 1–47, 2001.

Thomas W. Crowe, et al., *Terahertz GaAs Devices and Circuits for Heterodyne Receiver Applications,* Selected Topics in Electronics and Systems—vol. 4, pp. 209–245, 1996.

* cited by examiner

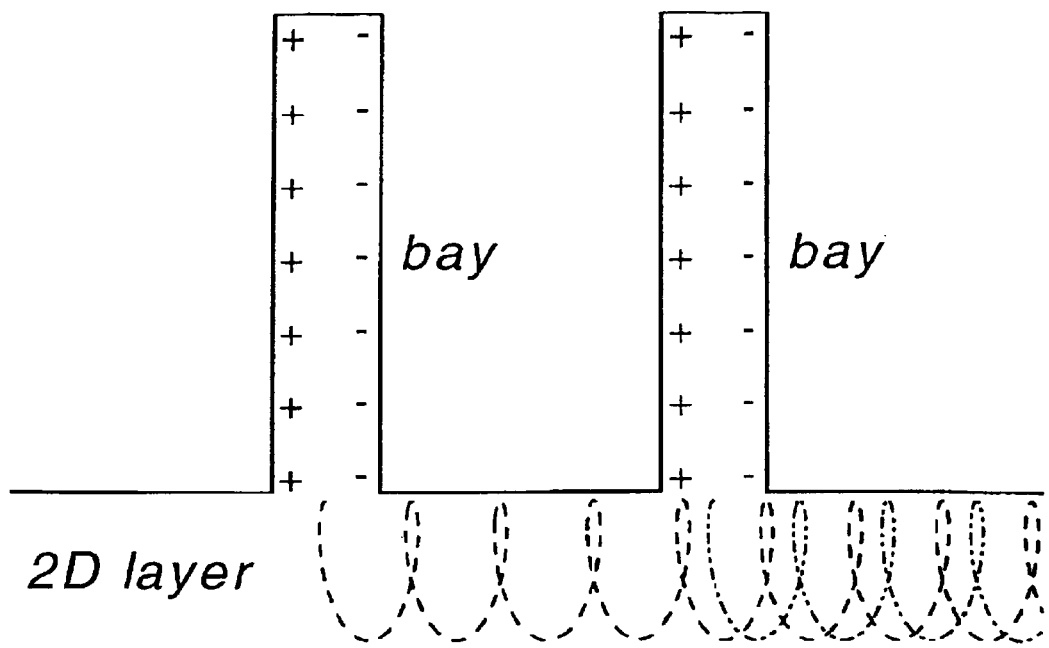
FIG. 4
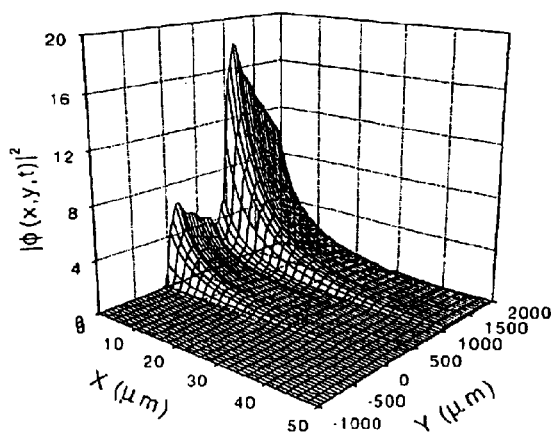
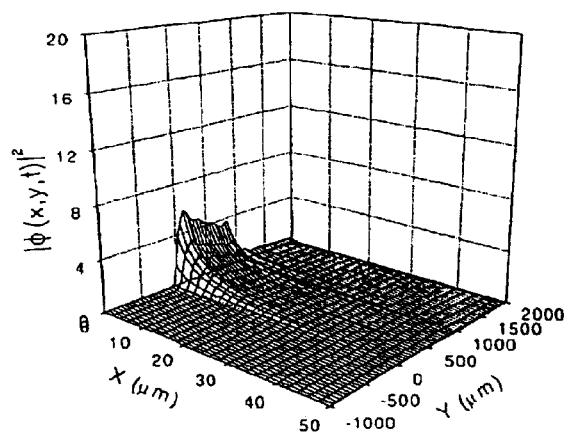
FIG. 5a          FIG. 5b

US 6,987,484 B2

DETECTOR FOR ELECTROMAGNETIC RADIATION AND A METHOD OF DETECTING ELECTROMAGNETIC RADIATION

FIELD OF THE INVENTION

The present invention relates to a detector for electromagnetic radiation in the GHz or THz range and to a method of detecting such radiation. More specifically, the present invention relates to solid-state detectors and spectrometers for electromagnetic radiation. The detector is tunable over a broad frequency range (from radio- and microwaves up to far-infrared (terahertz) frequencies) and combines the possibilities of measuring both the intensity (detection) and the frequency (spectroscopy) of incident electromagnetic radiation.

DESCRIPTION OF THE PRIOR ART

The most frequently used detectors of radiation in a frequency range of less than 100 GHz up to more than 3 THz are Schottky diodes, which use the nonlinearity of the current-voltage characteristics of a metal-semiconductor junction, as well as bolometers, pyroelectric detectors, and photoconductive detectors. For information on Schottky diodes reference can be made to the description T. W. Crow, R. J. Mattauch, R. M. Weikle, and U. V. Bhapkar, in Compound Semiconductor Electronics, edited by M. Shur (World Scientific, Singapore, 1996) and to U.S. Pat. No. 4,353,070. These devices are broadband detectors, which are able to detect the intensity of radiation but not their frequency. Analyzing the spectrum of the incident radiation requires combining these devices with additional interferometer schemes, containing, for instance, beam splitters, moving mirrors, gratings, and other elements. The interference of two split waves results in oscillating dependencies of the intensity of the measured radiation, as a function of the ratio $L/\lambda=L\,f/c$, where L is the (variable) distance to the moving mirror, f and $\lambda$ are the frequency and the wavelength of radiation, and c is the velocity of light. Measuring the period of these oscillating dependencies allows one to determine the frequency of the radiation. A drawback of such interferometers is the need for cumbersome mechanical arrangements in addition to the electronic elements.

To build a selective detector, sensitive not only to the intensity but also to the frequency of electromagnetic radiation, one can use resonant absorption of electromagnetic waves in solids, caused by electronic transitions between different electronic energy levels in the system. Such detection possibilities are for example described in: U.S. Pat. Nos. 5,914,497, 6,476,596 and H95 Benjamin V. Shanabrook and William J. Moore, U.S. Ser. No. 802286 of Nov. 27, 1985, as well as in the Paper by S. G. Matsik, M. B. M. Rinzan, A. G. U. Perera, H. C. Liu, Z. R. Wasilewski, and M. Buchanan, Appl. Phys. Lett. 82, 139 (2003).

Such detectors can be tunable, in a certain range of frequencies, as the electronic energy levels are sensitive, for instance, to an external electric field. An essential drawback of these devices is that they are able to work only at sufficiently low temperatures: in order to reduce the effects of thermal fluctuations, the operation temperature T should satisfy the condition $kT \ll \hbar\omega$, where k and h are the Boltzmann and the Planck constants, and $\omega=2\pi f$ is the circular frequency of radiation. For example, the TACIT detector of U.S. Pat. No. 5,914,497, based on intersubband transitions in a quantum-well structure and tunable over 1–5 THz frequency range, requires, according to theoretical estimates, about 10 K operation temperature. The heterojunction millimeter and submillimeter detector of US-PS H95, based on electronic transitions involving $D^-$ or $A^+$ centers can operate, according to the inventors, only "near absolute 0 temperature". In addition, the tunability range of devices based on electronic transitions is not very broad.

Attempts to avoid the necessity for cooling selective and tunable detectors of electromagnetic radiation down to low temperatures are described in the papers by M. Dyakonov and M. S. Shur, in Terahertz Sources and Systems, edited by R. E. Miles, P. Harrison, and D. Lippens (Kluver, Dordrecht, 2001), vol. 27 of NATO Science Series II. Mathematics, Physics and Chemistry, pp. 187–207 and by M. I. Dyakonov and M. Shur, IEEE Trans. Electron. Dev. 43, 380 (1996). In these papers it was theoretically proposed to employ resonant voltage tunable detection of terahertz radiation using plasmon resonances in a gated two-dimensional (2D) electron gas in field-effect transistors.

Several experimental papers have recently reported on the resonant detection of terahertz and subterahertz radiation by plasma waves in submicron field-effect transistors, see for example W. Knap, V. Kachorovskii, Y. Deng, S. Rumyantsev, J.-Q. Lii, R. Gaska, M. S. Shur, G. Simin, X. Hu, M. A. Khan, et al., in Appl. Phys. 80, 3433 (2002), and W. Knap, Y. Deng, S. Rumyantsev, and M. S. Shur, Appl. Phys. Lett. 81, 4637 (2002) as well as in double-quantum-well field-effect transistors with an additional grating, (X. G. Peralta, S. J. Allen, M. C. Wanke, N. E. Harff, J. A. Simmons, M. P. Lilly, J. L. Reno, P. J. Burke, and J. P. Eisenstein in Appl. Phys. Lett. 81, 1627 (2002)). Nonresonant detection of terahertz radiation in field effect transistors was reported in W. Knap, V. Kachorovskii, Y. Deng, S. Rumyantsev, J.-Q. Lii, R. Gaska, M. S. Shur, G. Simin, X. Hu, M. A. Khan, et al., J. Appl. Phys. 91, 9346 (2002).

The resonant excitation of two-dimensional plasmons in such systems does not require the condition $kT \ll \hbar\omega$, since transitions between electronic energy levels are not involved in the operation process. However, the resonant excitation of two-dimensional plasmons requires the fulfillment of another condition, namely $\omega\tau \gg 1$, where $\tau$ is the scattering time (at $\omega\tau \ll 1$ the plasma oscillations are overdamped and the detector response is a smooth function of $\omega$ and the gate voltage, so that one obtains a broadband detector). The condition $\omega\tau > 1$ can be fulfilled at $f \approx 1$ THz and at cryogenic temperatures ($T \approx 8$ K), but the parameter $\omega\tau$ dramatically goes down when one tries to reduce the frequency or to increase the temperature, see W. Knap, Y. Deng, S. Rumyantsev, J.-Q. Lii, M. S. Shur, C. A. Saylor, and L. C. Brunel, Appl. Phys. Lett. 80, 3433 (2002).

In addition, the operating frequency of the order of 1 THz can be achieved only if the carrier density is sufficiently large (of the order of $10^{12}$ cm$^{-2}$) and the gate length of the field-effect transistor is sufficiently short (smaller than 1 $\mu$m). This requires submicron technology and restricts the sensitivity of the device, as the ratio (size of the sample)/(wavelength of radiation) becomes much smaller than unity. In addition, strong requirements on the electron density (of the order of $10^{12}$ cm$^{-2}$ or higher) and on the mobility (to satisfy the condition $\omega\tau \gg 1$) impose essential restrictions on the range of tunability of 2D-plasmon based devices, as the tunability is assumed to be achieved by varying the gate voltage; and hence the density and the mobility. The use of the 2D-plasmon detection scheme of X. G. Peralta, S. J. Allen, M. C. Wanke, N. E. Harff, J. A. Simmons, M. P. Lilly, J. L. Reno, P. J. Burke, and J. P. Eisenstein, Appl. Phys. Lett. 81, 1627 (2002) requires, in addition, a grating constructed above the normal field effect transistor in order to couple the electromagnetic radiation with the 2D plasmon field. The same condition ($\omega\tau\gg1$) restricts the use of the cyclotron resonance for the selective detection of electromagnetic radiation.

BRIEF SUMMARY OF THE INVENTION

The object of this invention is to propose a fast, portable, selective detector of electromagnetic radiation, tunable over a broad range of frequencies, from radio- and microwaves (frequencies f below or of the order of 100 GHz, wavelengths λ longer than or of the order of 3 mm) up to far-infrared radiation (frequencies higher than or of the order of 3 THz, wavelengths shorter than or of order of 100 μm). Furthermore, the detector should be capable of operating at significantly higher temperatures than prior art detectors, more specifically preferably at ambient temperatures or at least at temperatures in the range between ambient (ca. 20° C.) and the boiling point of liquid nitrogen.

In order to satisfy this object there is provided a detector for electromagnetic radiation, especially for electromagnetic radiation in the GHz or THz range, the detector comprising a semiconductor structure having a 2D charge carrier layer or a quasi 2D charge carrier layer with an edge, at least first and second contacts to said charge carrier layer, said contacts being provided at said edge and being spaced apart by a distance, a device for measuring at least one of the photocurrent between said first and second contacts, the photovoltage between said first and second contacts and the resistance between said first and second contacts, a device for applying a magnetic field to said detector with a field component perpendicular to said charge carrier layer, an output signal of said measuring device providing information about at least one of the presence of electromagnetic radiation, the intensity of the incident electromagnetic radiation and the frequency of the incident electromagnetic radiation.

In addition there is provided a method of detecting electromagnetic radiation comprising the steps of:

exposing a 2D charge carrier layer or a quasi 2D charge carrier layer to a magnetic field having at least a component perpendicular to said 2D charge carrier layer and to electromagnetic radiation having at least an electric field component parallel to the said 2D charge carrier layer, thereby causing the excitation of edge magnetoplasmons in the presence of said electromagnetic radiation, detecting the excitation of said edge magnetoplasmons by reference to a measurement of a photovoltage, a photocurrent or a resistance related thereto and forming a result and evaluating said result of said measurement to obtain information about said electromagnetic radiation.

Thus, in the present invention a new method of resonant detection of electromagnetic radiation is proposed based on a resonant excitation of edge magnetoplasmons in semiconductor systems containing two-dimensional or quasi-two-dimensional electron or hole layers. The use of the edge magnetoplasmon excitations has the following essential advantages:

1. The frequency of the edge magnetoplasmons depends on the carrier density, magnetic field, and dimensions of the device (in particular the distance between potential contacts, or the distance between intentionally introduced "inhomogeneities" of the edge or boundary of the 2D system) and can therefore be tuned over a very broad range from MHz frequencies up to THz frequencies. For theoretical background information reference can be made to the following papers:

V. A. Volkov and S. A. Mikhailov, Zh. Eksp. Teor. Fiz. 94, 217 (1988); [Sov. Phys.-JETP 67, 1639–1653 (1988)]; V. A. Volkov and S. A. Mikhailov, in Landau Level Spectroscopy (Modern Problems in Condensed Matter Sciences, vol. 27.2), edited by G. Landwehr and E. I. Rashba (North-Holland, Amsterdam, 1991), chap. 15, pp. 855–907; and S. A. Mikhailov, in Edge Excitations of Low-Dimensional Charged Systems, edited by O. Kirichek (Nova Science Publishers, Inc., NY, 2000), chap. 1.

2. The excitation of the edge magnetoplasmons is not related to any transitions between electronic levels and therefore does not require the condition $kT\ll\hbar\omega$.

3. The decay rate of the edge magnetoplasmons can be smaller than their frequency not only at $\omega\tau\gg1$, but also in the opposite limit $\omega\tau\ll1$ (in the Paper P. J. M. Peters, M. J. Lea, A. M. L. Janssen, A. O. Stone, W. P. N. M. Jacobs, P. Fozooni, and R. W. van der Heijden, Phys. Rev. Lett. 67, 2199 (1991) the edge magnetoplasmons have been experimentally observed at $\omega\tau=10^{-6}$). This offers an opportunity to resonantly excite edge magnetoplasmons, and hence to selectively detect the electromagnetic radiation, across a very broad range of frequencies and at sufficiently high temperatures (the operation of the proposed principle has been experimentally demonstrated at T=80 K, see below).

4. The proposed scheme involves the interference of the excited edge magnetoplasmons inside the device, and allows one to automatically measure both the intensity and the frequency of electromagnetic radiation, without using cumbersome external interference schemes with mechanically tuned mirrors or similar spectrometric systems.

The proposed operation principle works in semiconductor structures with one or more two-dimensional (or quasi-two-dimensional) charged layers (electrons or holes), with one or more pairs of contacts (ohmic contact, Schottky-barrier contact or any other type of tunnel-barrier contact) and, optionally, with several additional boundary elements ("inhomogeneities"), such as e.g. protrusions and indentations, intentionally designed with the aim to violate the translational invariance of the straight boundary of the system. The proposed principle of operation includes the following physical steps:

1. Incident electromagnetic radiation excites edge magnetoplasmons inside the device, at a straight edge or at intentionally introduced "inhomogeneites" of the edge or boundary and/or at the contacts to the quasi-two-dimensional system;

2. Edge magnetoplasmons, excited by different features of the structure such as the aforementioned inhomogeneites and contacts, separated by a distance L along the boundary, interfere with each other, which leads to a complicated oscillating electric field inside the device. The amplitude of this field depends on the ratio of the distance L to the wavelength of the edge magnetoplasmons, which, in its turn, is a function of the radiation frequency, applied magnetic field, and the carrier density in the device.

3. The oscillating electric field inside the device is rectified by non-linear behaviour of the device (for example, by Schottky behaviour of potential contacts or by non-linear behaviour of tunnel-barrier contacts), resulting in a dc voltage between different pairs of potential contacts. Due to the said interference of the edge magnetoplasmons inside the device, the rectified photovoltage between potential contacts is an oscillating function of the frequency of radiation, of the magnetic field, and of the carrier density. Measuring the period of these photovoltaic oscillations as a function of magnetic field, at a fixed carrier density and fixed geometry, allows one to analyze the frequency of the radiation. The amplitude of the measured signal contains information on the intensity of the radiation. The measurement of the photovoltage between the first and second contacts does not require an externally imposed current.

4. Due to the same or similar physical reason the resistance between different pairs of potential contacts is also an oscillating function of the frequency of the electromagnetic radiation, of the magnetic field and of the carrier density. Measuring the period and the amplitude of these photoresistance oscillations as a function of the magnetic field, at a fixed carrier density and fixed geometry, offers another possibility to analyze the frequency and the intensity of the electromagnetic radiation.

5. A further possibility is to measure the photocurrent between the first and second contacts as a function of the applied magnetic field.

The feasibility of the method has been experimentally demonstrated in GaAs/AlGaAs quantum-well devices, fabricated in the form of a conventional Hall bar, as well as in a shape containing additional intentionally introduced protrusions of the boundary. The photoresistance effect exhibited easily detectable oscillations at temperatures up to 10 K. The photovoltaic effect exhibited easily detectable oscillations at temperatures up to 80 K. Theoretically, there is however no reason why the invention should not work at higher temperatures up to and above ambient. The signal quality will admittedly diminish with increasing temperature, however, theoretical considerations show that the temperature dependence is not particularly significant. In the experiment for the frequency range of about 20–50 GHz about 20–40 oscillations were observed. This gave a Q-factor and spectral resolution of about 1–2 GHz for the specific device used in these experiments.

Preferred embodiments of the detector and of the method of detecting intensity and frequency of electromagnetic radiation can be found in the claims and in the further description.

To direct the electromagnetic radiation onto the detector a combination of the detector with at least one of a lens, a horn, a window and a waveguide is particularly useful. Various applications can be conceived using such a combination. For example, it is known that various substances have different absorption coefficients for electromagnetic radiation in various frequency ranges. The differential absorption or transmission of electromagnetic radiation can, for example, be exploited to detect plastic explosives or weapons at an airport security terminal. For example, the usual security portal or gate through which each passenger has to pass in order to gain access to the departure gates of an airport is usually designed to detect metal components carried by the passenger. The detector of the present invention would make it possible to have horns or waveguides emitting electromagnetic radiation in one or more frequency ranges arrayed down one side of the portal with the detector on the other side of the portal, optionally with a lens in front of the detector and detection of plastic explosives or plastic weapons is possible by comparing the known spectrum of the emitted electromagnetic radiation with the attenuated spectrum of the electromagnetic radiation as detected by the detector. The compact nature of the detector and its lack of moving components means that a system of this kind is a real possibility.

Equally, it is known that different types of body tissue have different absorption characteristics for electromagnetic radiation, so that the detector of the present invention can be potentially used to detect for instance cancerous tissue in a human body or tooth decay at a relatively early stage of development. Again a horn or waveguide can be used to direct the electromagnetic radiation to the area of the patient's body to be investigated and a detector, optionally with a lens present in front of it, can be used to detect the spectral composition of the electromagnetic radiation passing through the patient's body. A comparison with the spectrum of the emitted electromagnetic radiation should then allow the cancerous tissue to be detected.

The detector can be also used in telecommunication applications.

Each physical realization of the device, with a certain geometry of the edge (the aforementioned distance L between contacts or inhomogeneities) and with a certain (fixed) charge carrier density, will be best suitable for operating in a particular frequency range. Therefore it is also possible to provide a plurality of detectors each adapted to cover a different frequency range. Thus, many detectors covering different frequency ranges can be provided on one chip, or on a plurality of associated chips, and known multiplexing arrangements can be used to lead out the signals from the various detectors on the chip or chips.

The invention will now be described in more detail with reference to specific embodiments thereof as illustrated, by way of example only, in the accompanying drawings.

BRIEF LISTING OF THE DRAWINGS

In the drawings:

FIGS. 1a, 1b and 1c schematically show an example of an edge "inhomogeneity" (a projection, protrusion, or bay), without an attached contact (FIG. 1a) and with an attached contact (FIG. 1b), used to excite the edge magnetoplasmons in the proposed device, as well as a contact with an additional intentionally introduced tunnel barrier structure for getting an additional control of nonlinear characteristics of the contact (FIG. 1c).

FIG. 2 shows the theoretically calculated distribution of the potential field of the edge magnetoplasmons, emitted from an edge "inhomogeneity" of the type shown in FIG. 1.

FIGS. 3a to 3d schematically show several other examples of edge "inhomogeneities", which can be used for excitation of edge magnetoplasmons in the proposed device.

FIG. 4 schematically illustrates the excitation and the interference of edge magnetoplasmons, emitted from two neighbouring edge inhomogeneities of the type shown in FIG. 1.

FIGS. 5a and 5b show a theoretically calculated distribution of the potential field of the edge magnetoplasmons, emitted from two edge inhomogeneities of the type shown in FIG. 4, under the conditions of constructive interference (FIG. 5a) and destructive interference (FIG. 5b).

Figure 9:
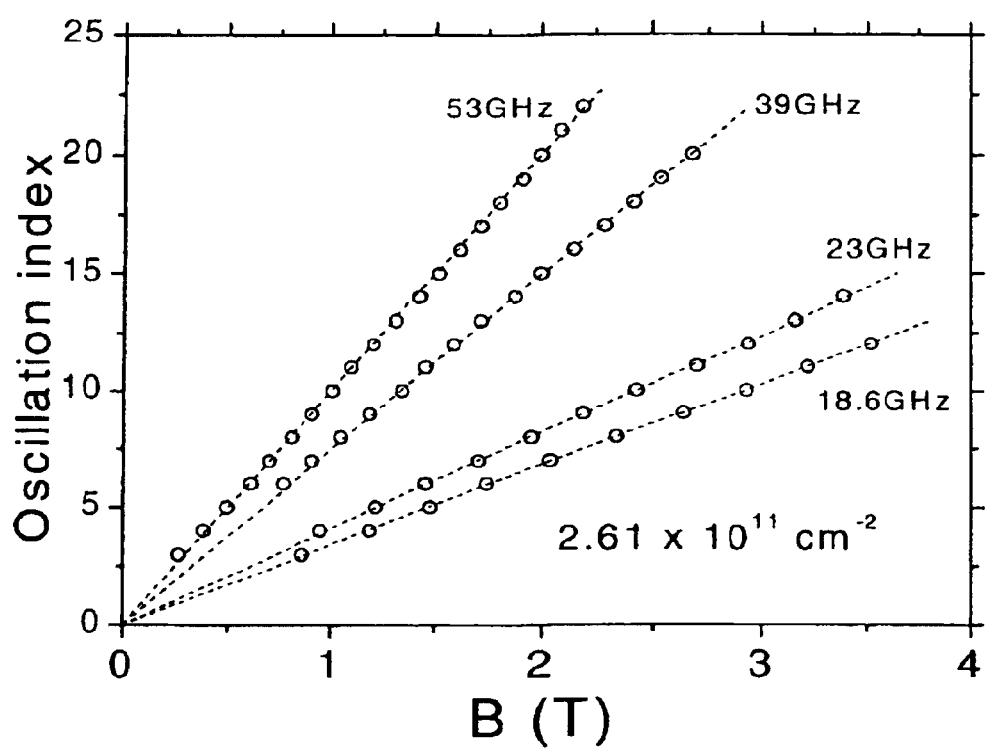

FIG. 9 quantitatively illustrates the periodicity of the measured photoresistance oscillations in direct magnetic field.

Figure 10A:
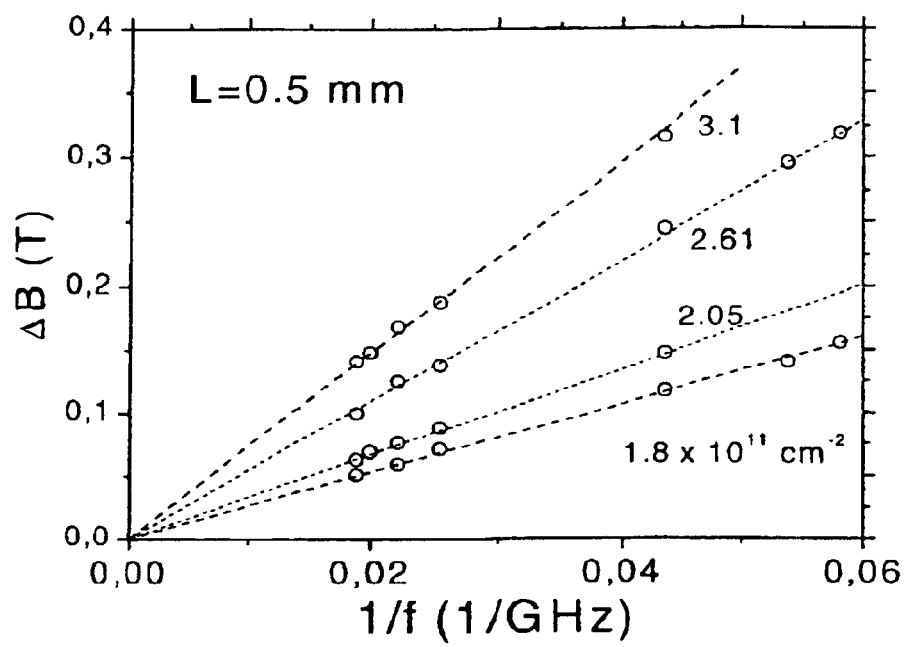
Figure 10B:
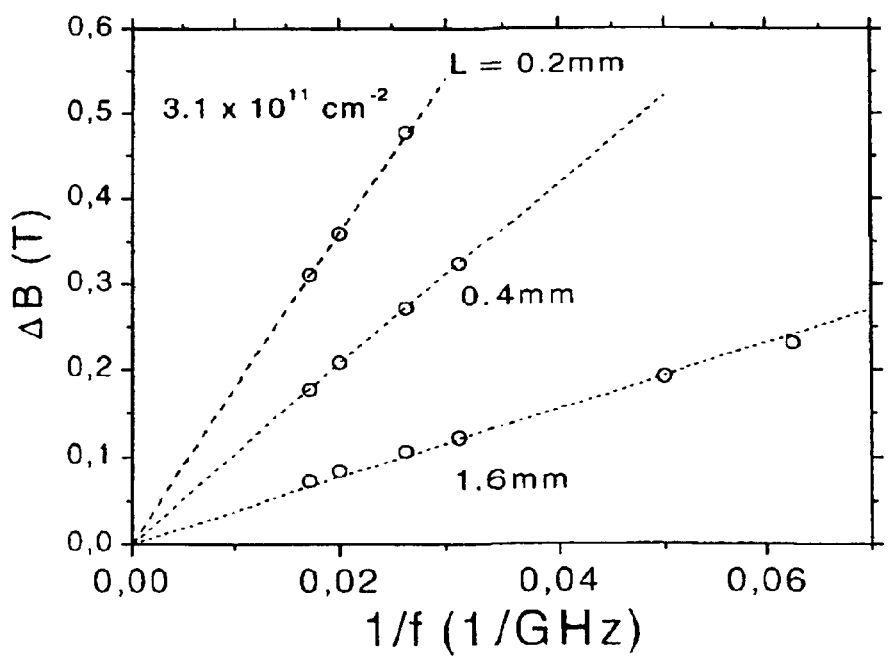

FIGS. 10a and 10b illustrate the dependence of the experimentally measured period of photoresistance oscillations on the microwave frequency, charge carrier density, and the distance between potential contacts in the Hall-bar device.

Figure 11:
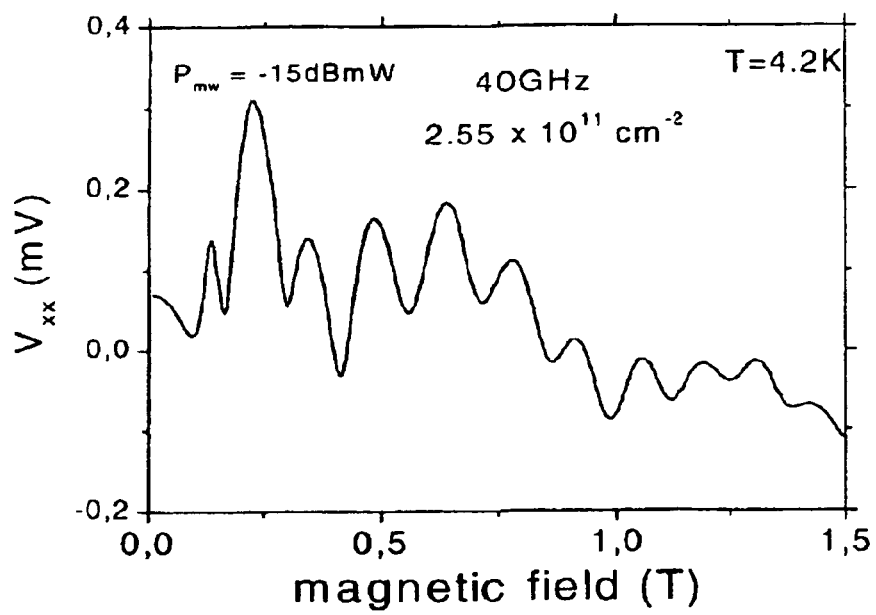

FIG. 11 demonstrates the microwave induced photovoltaic oscillations at the frequency 40 GHz at low temperature (4.2 K).

Figure 12:
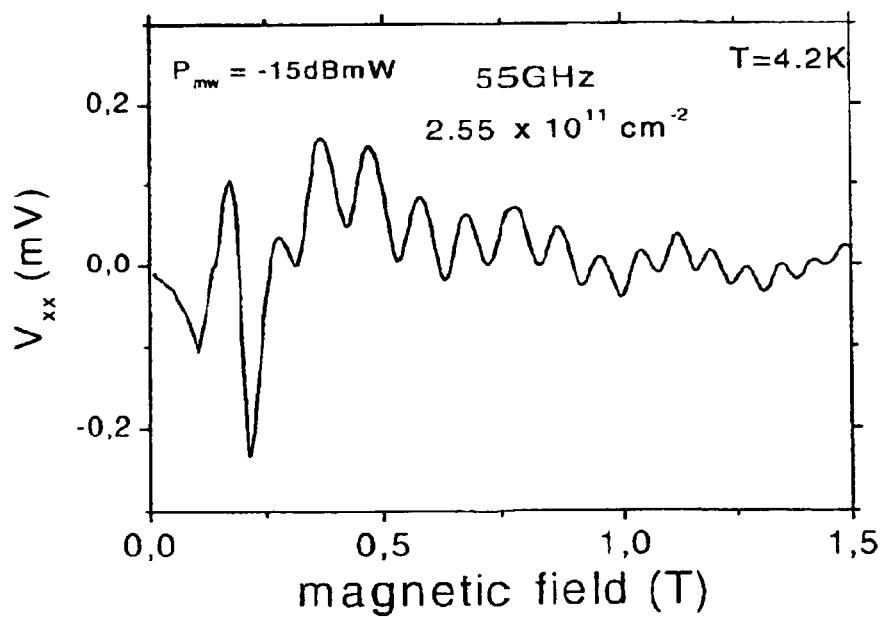

FIG. 12 demonstrates the microwave induced photovoltaic oscillations at the frequency 55 GHz at low temperature (4.2 K).

Figure 13:
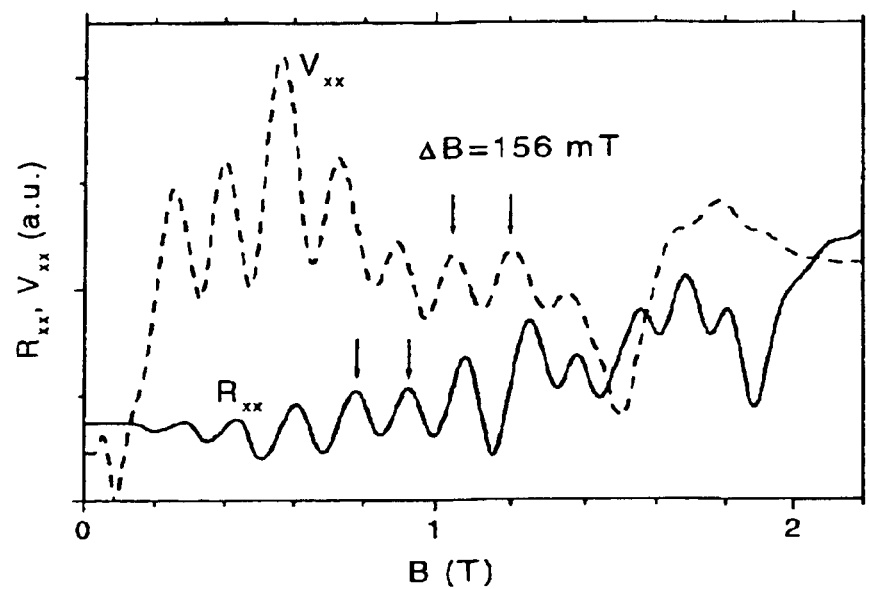

FIG. 13 shows on the same plot the microwave induced B-periodic photovoltaic and photoresistance oscillations, and illustrates that the period is the same and hence that both effects have a common origin.

Figure 14:
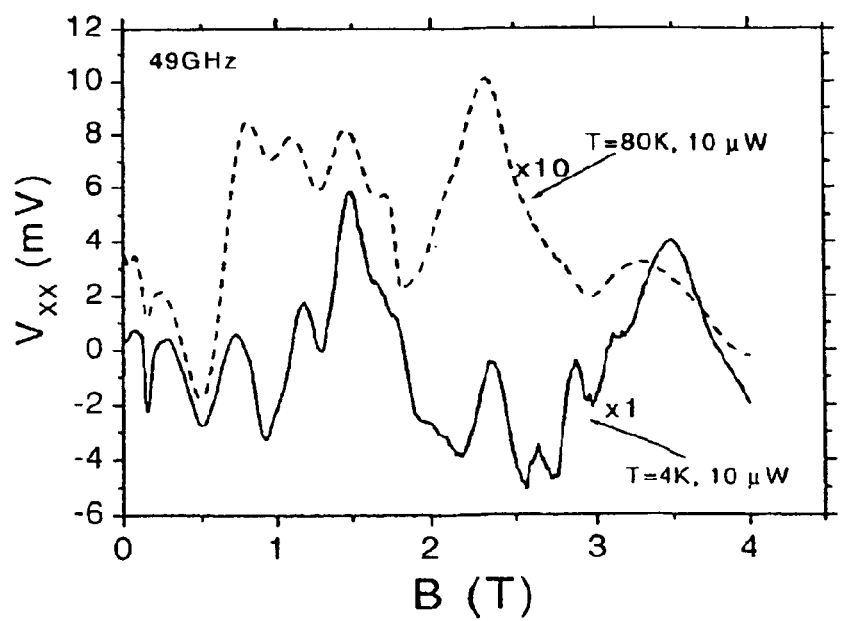

FIG. 14 shows the microwave induced oscillations of the photovoltage measured at low (4 K) and high (80 K) temperatures, and illustrates the feasibility of the proposed method at liquid nitrogen temperatures.

Figures 15, 16:
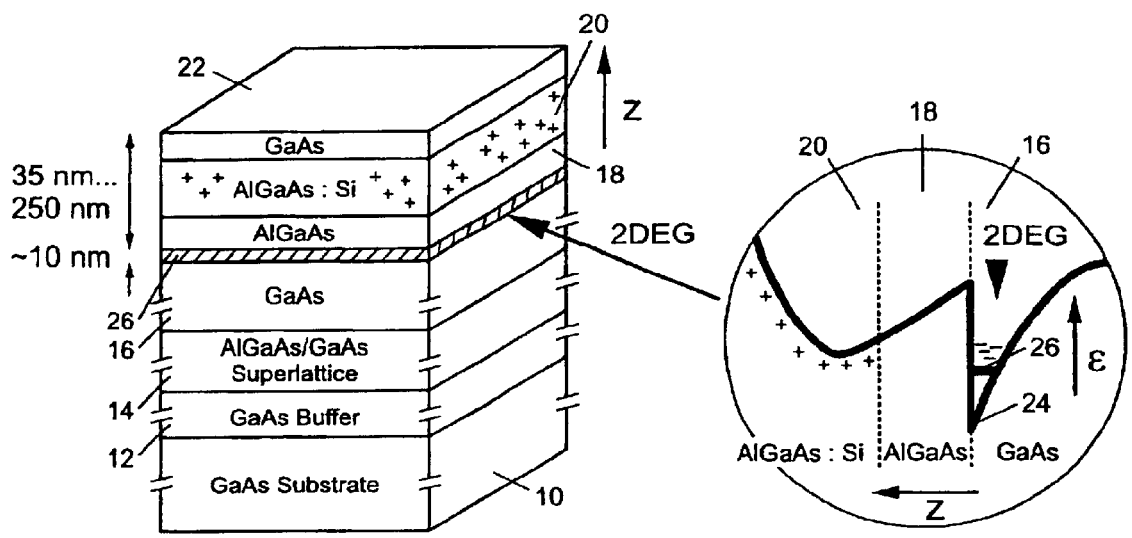

FIG. 15 shows a schematic cross-section through an AlGaAs/GaAs compound semiconductor having a single heterojunction for use in a first embodiment of a detector in accordance with the present invention.

FIG. 16 shows a band diagram for the semiconductor structure of FIG. 15.

Figures 17, 18:
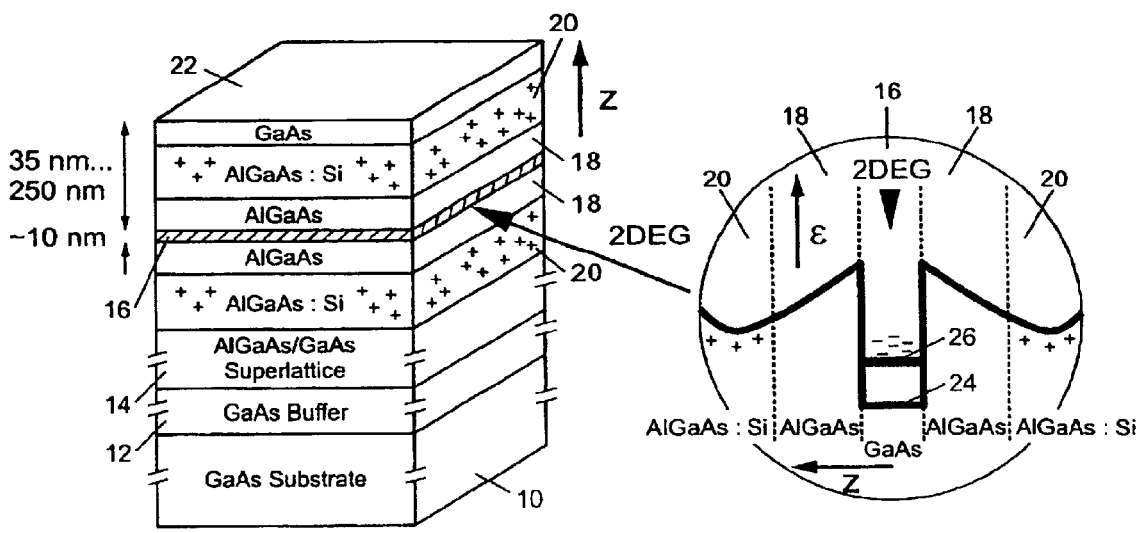

FIG. 17 shows a schematic cross-section through an AlGaAs/GaAs compound semiconductor having a single quantum well for use in a second embodiment of the present invention.

FIG. 18 shows a band diagram for the semiconductor structure of FIG. 17.

Figure 19:
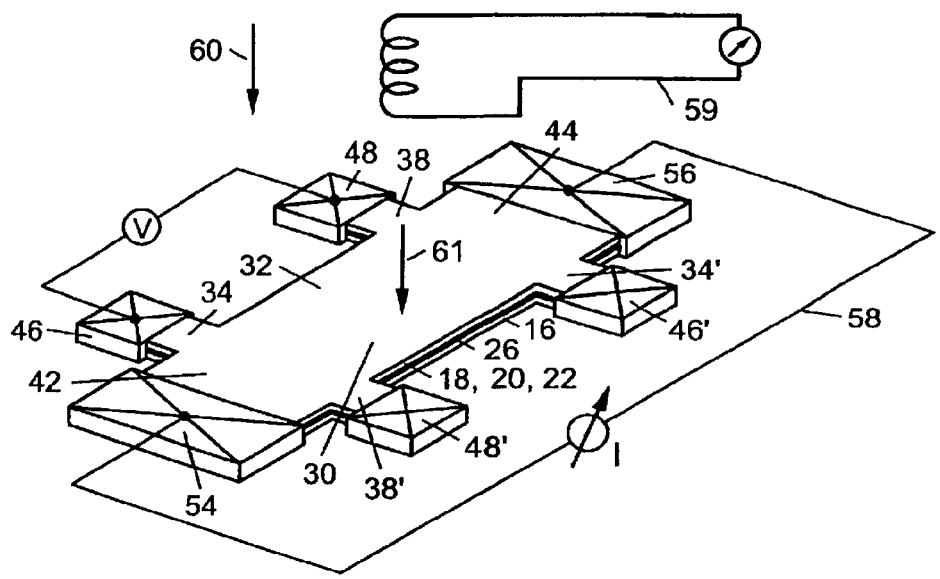
Figures 20, 21:
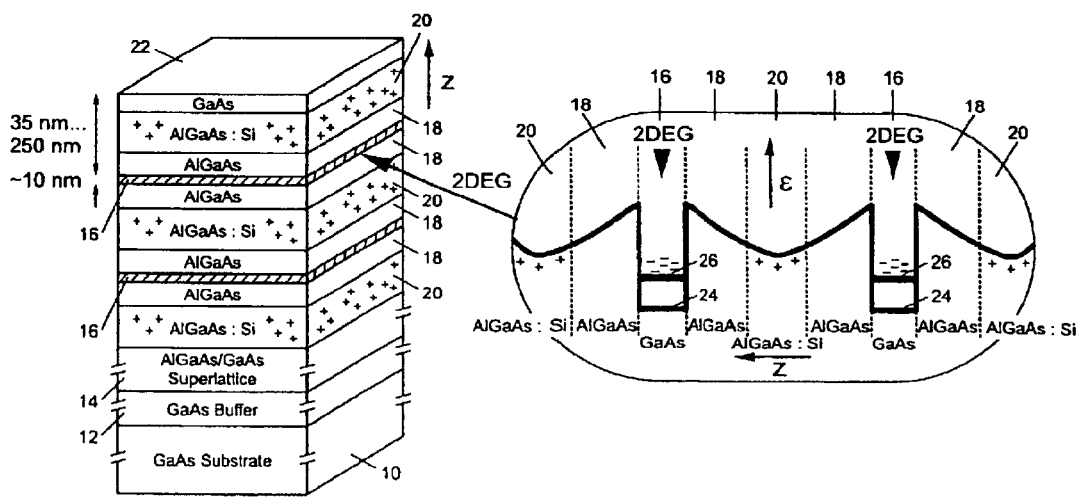
Figure 22:
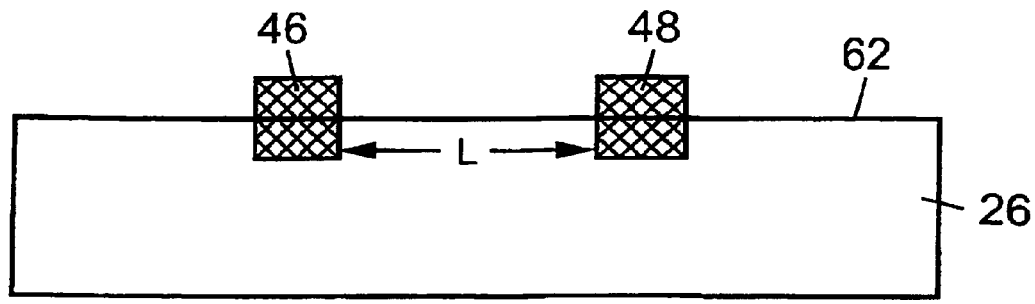
Figure 23:
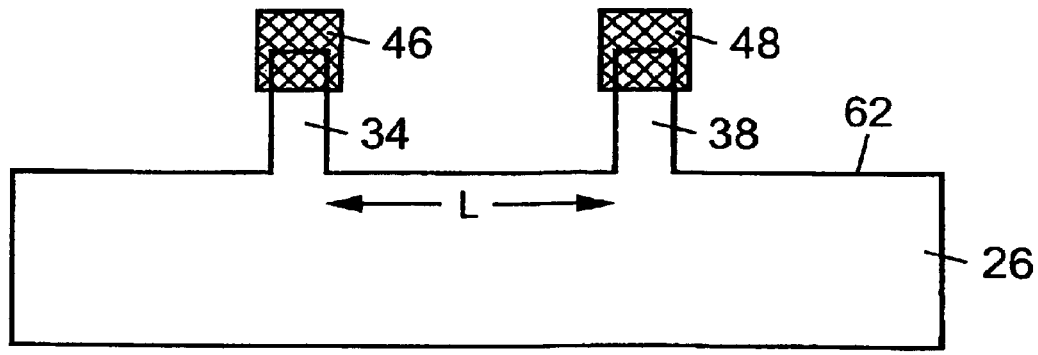
Figure 24:
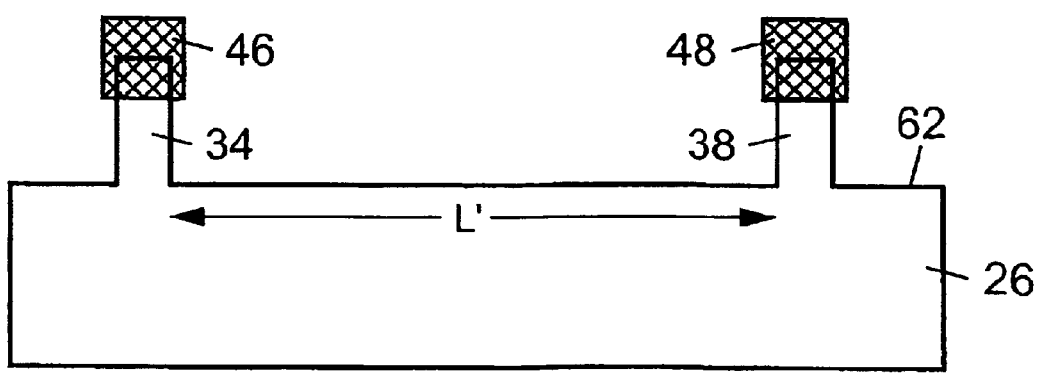
Figure 25:
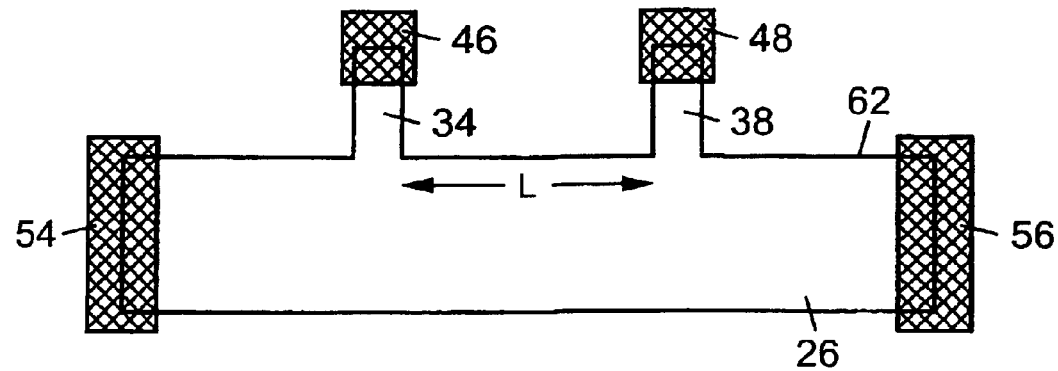
Figure 39:
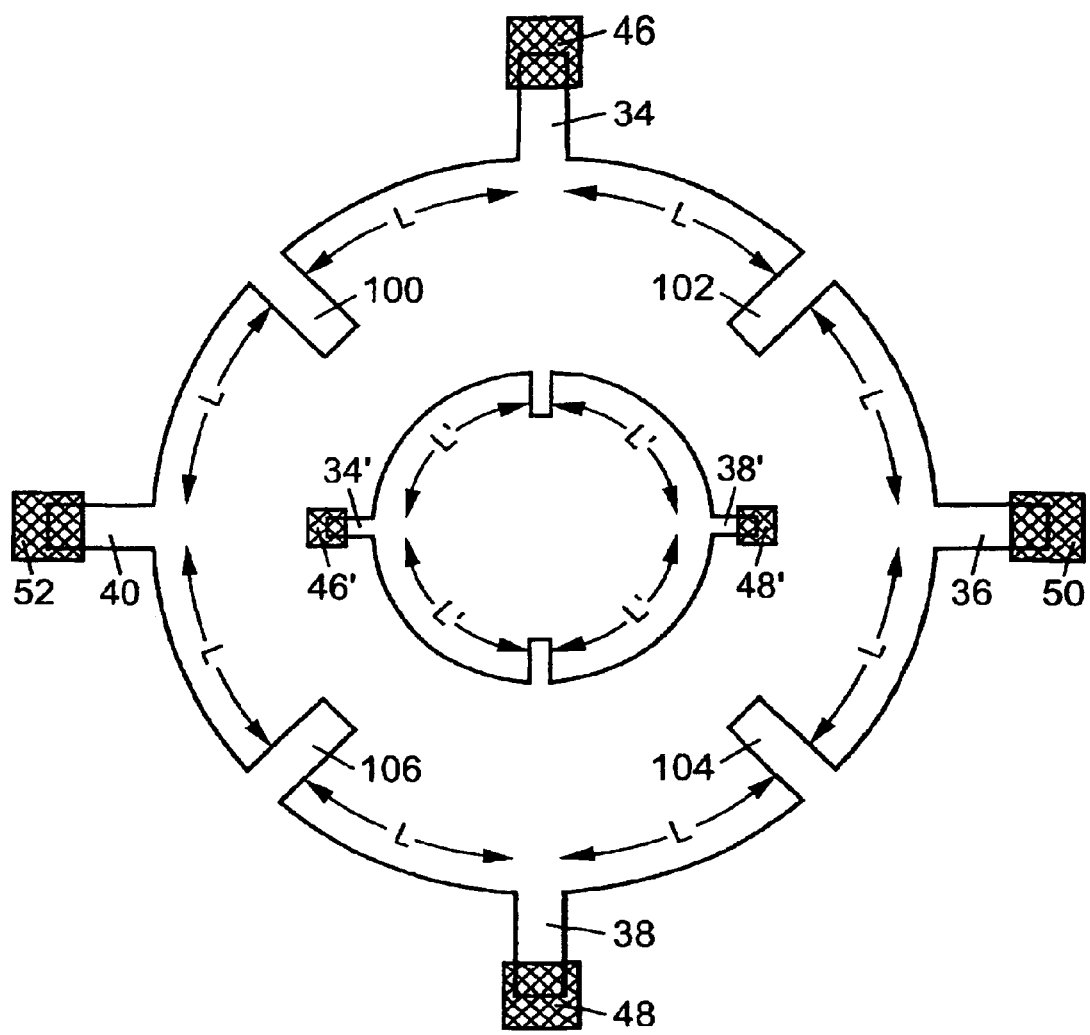
Figure 40:
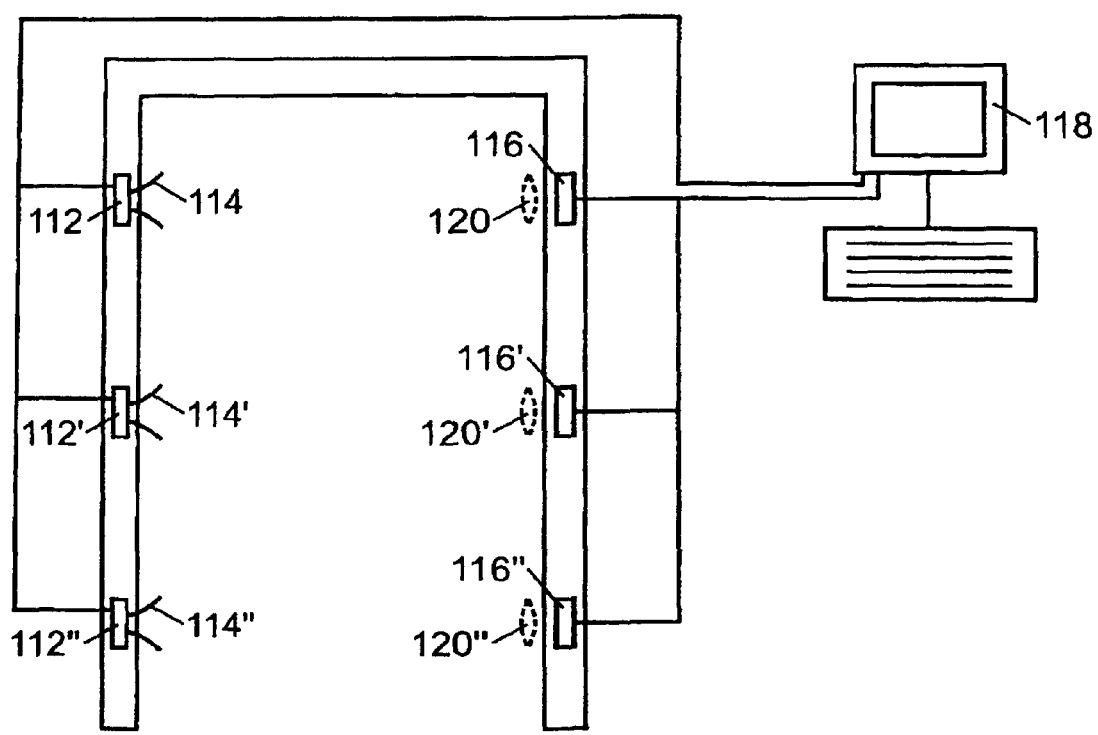
Figure 41:
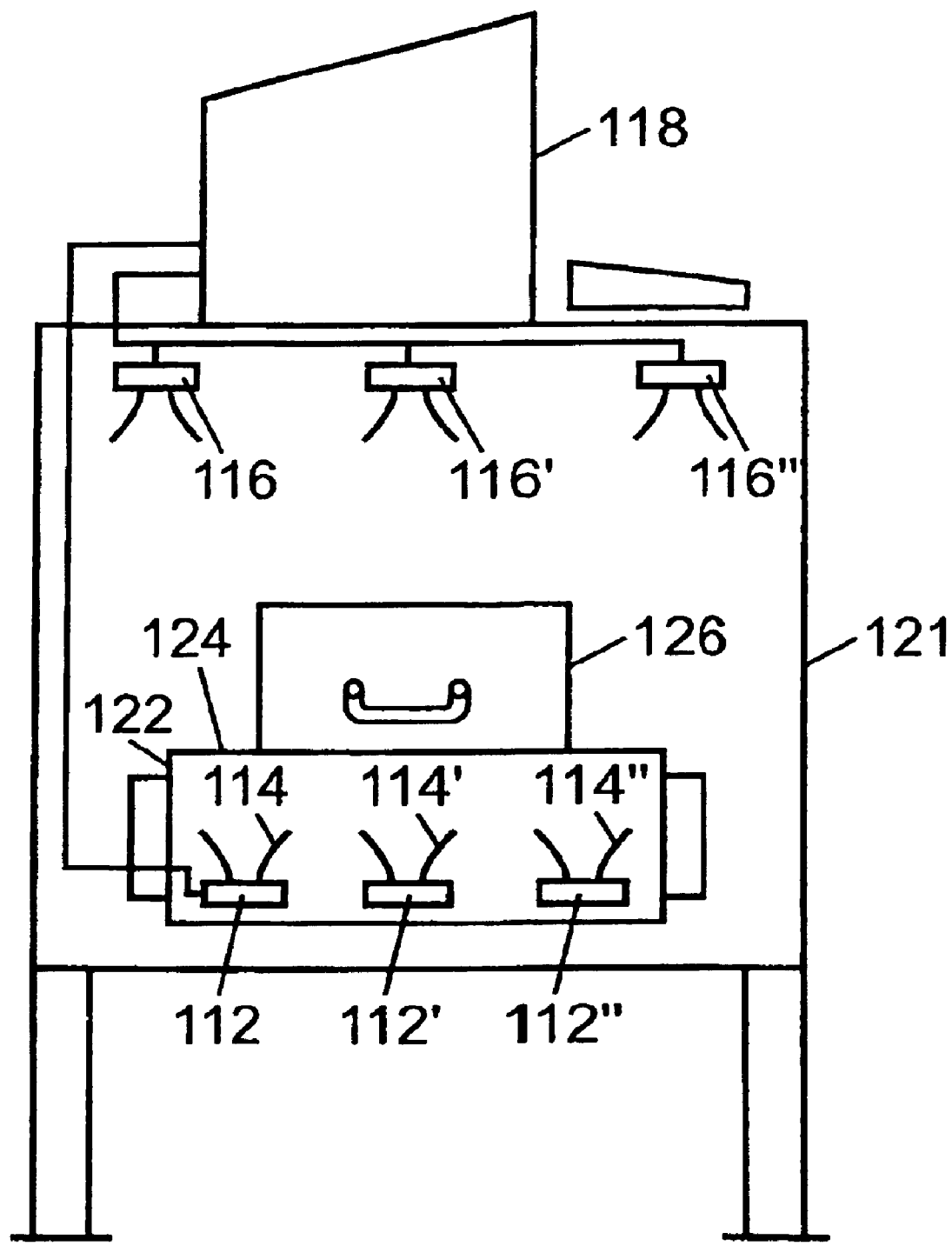
Figure 42:
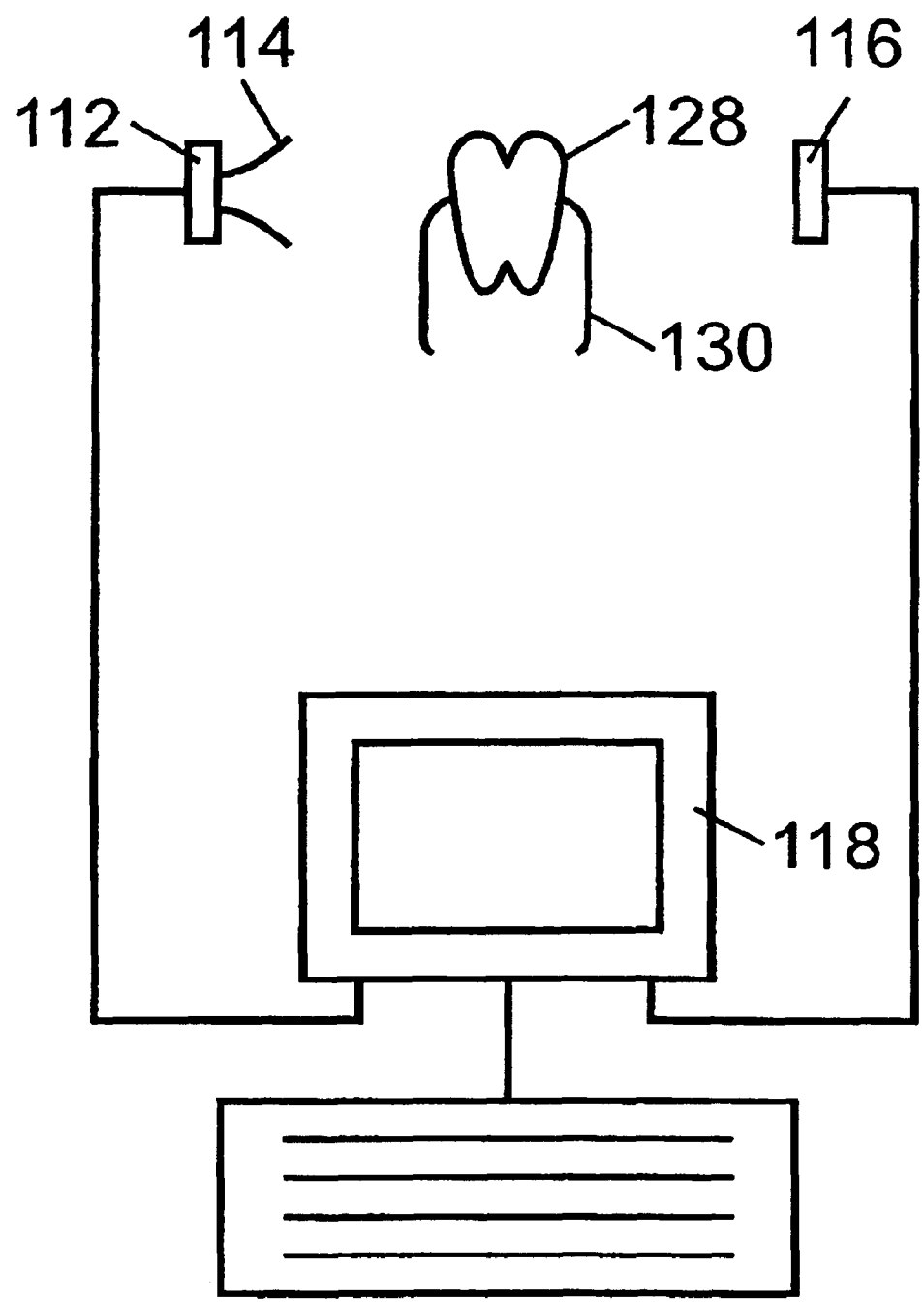

FIG. 19 shows a perspective view of a detector utilising the semiconductor structure of FIG. 15, FIG. 20 shows an alternative AlGaAs/GaAs double quantum well structure for a detector in accordance with the present invention, FIG. 21 shows the band diagram for the double quantum well structure in accordance with FIG. 15, FIG. 22 shows a first simplified diagram of a two-dimensional charge carrier layer having first and second contacts for the simplest realisation of the present invention, FIG. 23 shows a diagram similar to that of FIG. 22 with first and second projections from the charge carrier layer and first and second contacts each to one of the respective projections, FIG. 24 shows a diagram similar to that of FIG. 23 but with a different spacing of the said projections, FIG. 25 shows a diagram of a further arrangement similar to that of FIG. 23 but with third and fourth contacts to said charge carrier layer, FIGS. 26–39 show further diagrams of possible topographies of a charge carrier layer and contacts to it for use in a detector in accordance with the present invention, FIG. 40 shows a schematic illustration of a security portal for use at an airport or other travel facility for checking for the presence of metallic or plastic articles carried by the passenger, FIG. 41 shows a schematic illustration of a similar safety installation at an airport or other travel facility for checking passenger luggage, FIG. 42 shows a schematic illustration of a medical application of the detector of the present invention.

DETAILED DESCRIPTION OF THE INVENTION

A. Theoretical Background

1. Two-Dimensional Electron Systems

The proposed detector and method can in principle be realised in any solid state structure containing two-dimensional or quasi-two-dimensional layers of charge carriers (electrons or holes), for example:

Silicon based metal-oxide-semiconductor field effect transistors

GaAs/AlGaAs based heterostructures with a single heterojunction

GaAs/AlGaAs based single quantum-well structures

GaAs/AlGaAs based double quantum-well structures

GaAs/AlGaAs based multiple quantum-well structures (many-layer super-lattices)

Any other semiconductor structures based on other material systems, containing one or more two-dimensional or quasi-two-dimensional electron or hole layers. The device should be placed in a (moderate) perpendicular magnetic field.

2. Edge Magnetoplasmons in Two-Dimensional Charged Systems

Edge magnetoplasmons are collective excitations of a (quasi-) two-dimensional charged (electron or hole) system, strongly localized near the boundary or edge of the charged layer. At magnetic fields B, satisfying the condition $\omega<\omega_c$ ($\omega_c=eB/m^*$ is the cyclotron frequency, $m^*$ and e are the effective mass and the charge of the carriers (electrons or holes)), the dispersion equation of the edge magnetoplasmons can be approximated by the formula $$\omega = Cqn_s/B\in, \quad (1)$$

where $n_s$ is the density of charge carriers (electrons or holes), $\in$ is an effective dielectric constant of the surrounding medium, q is the edge-magnetoplasmon wavevector, determined by a typical length scale L, characteristic for a given problem (L may be related to the size of the sample, or the distance between potential contacts, or the distance between intentionally introduced "inhomogeneities" of the boundary, see below), and C is a weak (logarithmic) function of parameters of Eq. (1) (for the purposes of the present invention C can be approximately considered as a constant). As the carrier density, magnetic field, and the length L can be widely varied in the same or in different devices, the edge magnetoplasmon frequency is tunable over a very broad range. Contrary to the normal two-dimensional plasmons at zero magnetic field B=0, the edge magnetoplasmons have an essentially smaller damping, and were experimentally observed in semiconductor structures even in the MHz frequency range, i.e. even in the regime where $\omega\tau<<1$ (in the Paper P. J. M. Peters, M. J. Lea, A. M. L. Janssen, A. O. Stone, W. P. N. M. Jacobs, P. Fozooni, and R. W. van der Heijden, Phys. Rev. Lett. 67, 2199 (1991) the edge magnetoplasmons have been experimentally observed at $\omega\tau=10^{-6}$).

Similar collective excitations of a three-dimensional charged (electron or hole) system—surface magnetoplasmons (as described in A. L. Fetter, Phys. Rev. B 32, 7676 (1985))—have a frequency, inversely proportional to the magnetic field, similar to the equation (1), but independent of the wavevector q (in the long-wavelength limit). The quasilinear dependence (1) of the edge-magnetoplasmon frequency $\omega$ on the wavevector q is an important concept for the present invention. The quasi-two-dimensional nature of the charged layers and the related fact of the existence of gapless edge collective plasma modes (edge magnetoplasmons), are thus an important recognition underlying the present invention.

3. Excitation of the Edge Magnetoplasmons By External Electromagnetic Waves

Figure 1C:
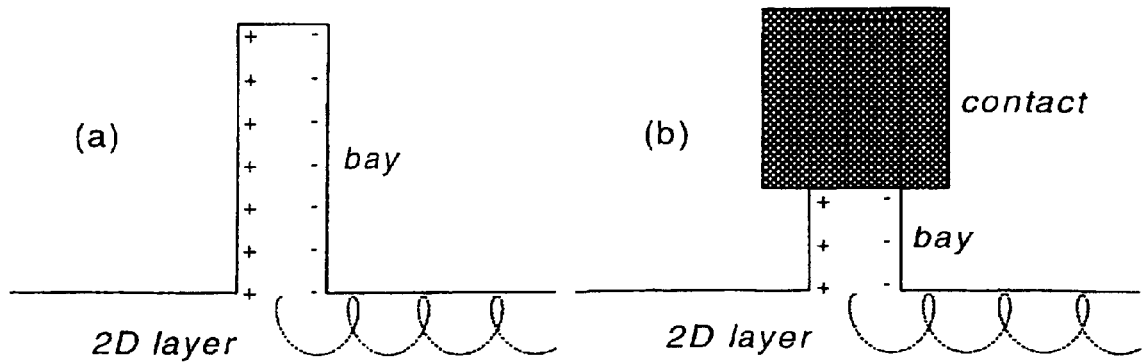
Figure 1C:
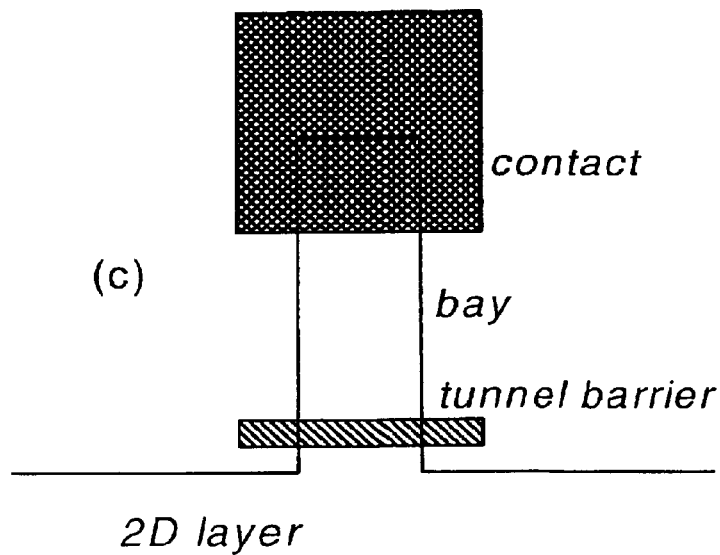

The edge magnetoplasmons can be directly excited in a quasi-2D charged system by the external electromagnetic radiation. For the purposes of the present invention, the excitation of the edge magnetoplasmons near an intentionally introduced edge "inhomogeneity" and/or near a contact is important. FIG. 1 shows the boundary of a 2D charged system with an intentionally introduced "inhomogeneity" (projection or protrusion), which is here called a "bay" (FIG. 1a) which may (but not necessarily) additionally be contacted (FIG. 1b). As can be seen from FIG. 1a the oscillating electric field of the electromagnetic wave with the frequency c induces near a simple inhomogeneity (protrusion or bay) of the 2D electron or hole layer an oscillating dipole moment and emits the edge magnetoplasmons (schematically shown by a spiral curve), transforming the energy of the incident electromagnetic radiation into the energy of the edge magnetoplasmons. This oscillating dipole serves as a small antenna, which emits edge magnetoplasmons with the frequency ω and the wavevector q determined by the edge-magnetoplasmon dispersion relation (1). The edge magnetoplasmons propagate along the edge of the sample in the direction dictated by the orientation of the external magnetic field and by the charge of the carriers.

FIG. 1b shows that a contact can be added to the protrusion in order to measure the effect one needs at least two contacts in the whole device if it is desired to measure the voltage or resistance produced by the edge magnetoplasmons inside the device as will be explained later. If in the whole device there are only two protrusions, like in FIGS. 22, 23, 24, both must be contacted; if there are many protrusions, as e.g. in FIGS. 27, 28, only two of them must be contacted, others can be contacted but do not necessarily have to be contacted.

As will be also explained later, for measuring the signal produced by the edge magnetoplasmons inside the device nonlinear characteristics of the contacts are important. FIG. 1c shows that in order to get a better control of the nonlinear characteristics of the contact region, an additional element—a tunnel barrier—can be introduced (but is not essential) in the protrusion region between the physical contact and the 2D charge carrier layer.

Figure 2:
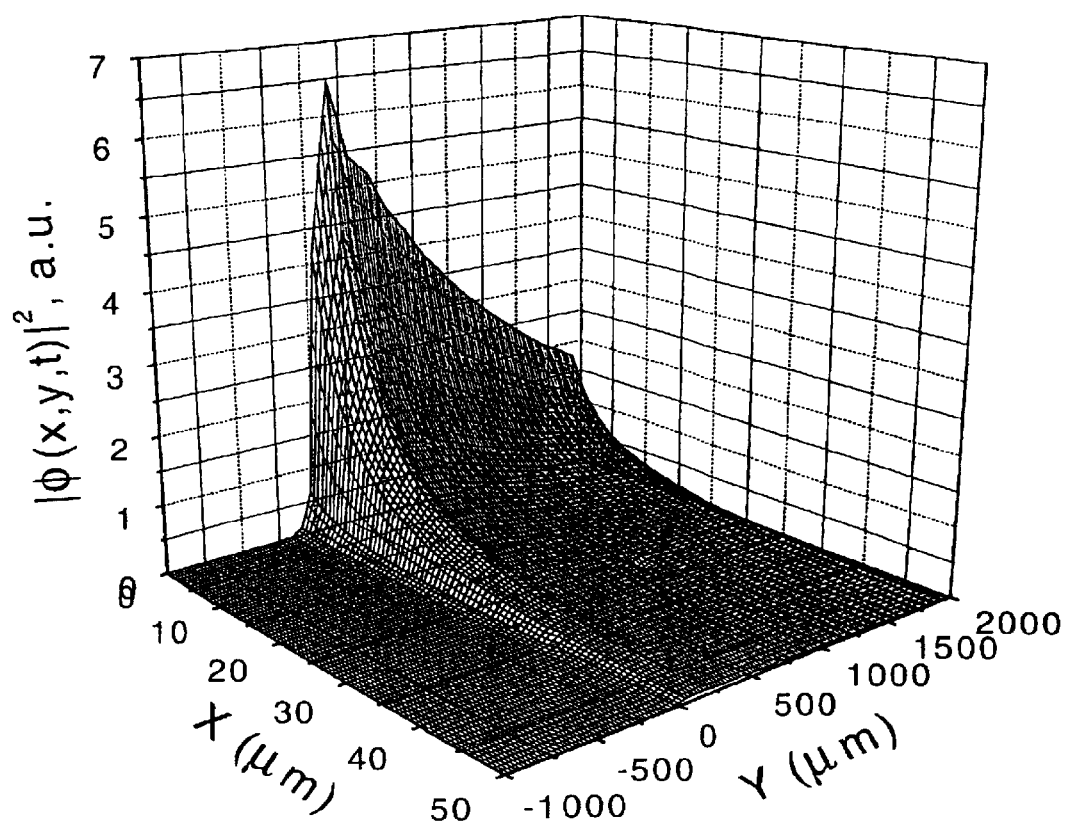

FIG. 2 displays the calculated intensity of the edge magnetoplasmon field, emitted by a dipole localized near the bay of the type shown in FIG. 1. More specifically, FIG. 2 shows the theoretically calculated squared potential of the edge magnetoplasmons, emitted from the bay of the type shown in FIG. 1 by the incident electromagnetic radiation. Parameters are $n_s=2.6\times10^{11}$ cm$^{-2}$, $\mu=3\times10^6$ cm$^2$/Vs, f=53 GHz, B=0.584 T, width of the contact≈40 µm. A very large difference in the scales along the x and y axis should be noted, while the edge magnetoplasmon is strongly localised near the edge (at a distance of the order of 20 µm) it propagates along the edge for the distance of several mm.

Figures 3A, 3B:
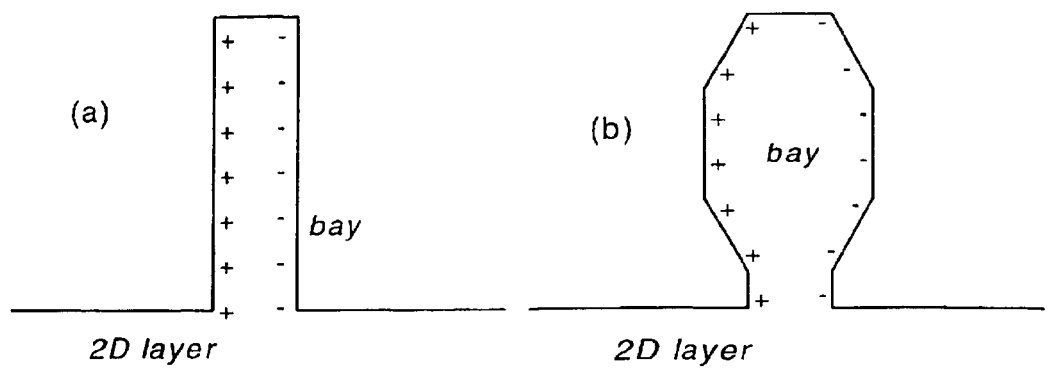
Figures 3C, 3D:
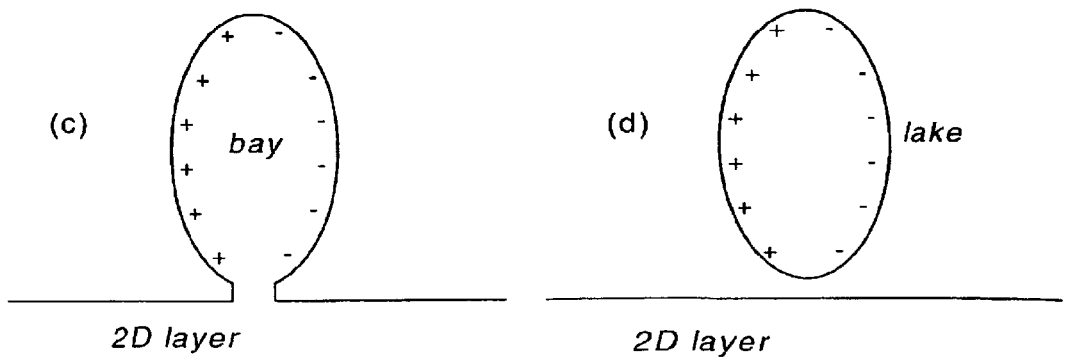

As shown in FIG. 3 the form of the bay does not have to be rectangular. The inhomogeneities can, for example, have any of the shapes shown in FIGS. 3a to 3c and can also be realized in the form of an isolated "lake" of (quasi) two-dimensional charges as shown in FIG. 3d. Thus, if not contacted, the inhomogeneity does not necessarily have to be in electrical contact with the quasi-two-dimensional layer. The specific form of the bay may influence the efficiency of the edge magnetoplasmon emission from it, but does not change the essence of the invention at this point. The present teaching can be realised with all possible forms of edge inhomogeneities used for the excitation of the edge magnetoplasmons, irrespective of whether these inhomogeneities are contacted or not.

4. Interference of Edge Magnetoplasmons Excited By An Electromagnetic Wave At Two or More Edge Inhomogeneities Two or more inhomogeneities (bays), localized near the edge of the (quasi-) two-dimensional charged layer and irradiated by the external electromagnetic wave, emit edge magnetoplasmons coherently, if the distance L between the bays does not exceed the wavelength λ of the electromagnetic radiation, L<λ. This leads to an interference of the edge magnetoplasmons governed by the parameter q(ω)L, where L is the distance between the bays and q(ω) the wavevector of the edge magnetoplasmons, determined by Eq (1). The condition L<λ is easily fulfilled in the considered frequency range. For example, in a device designed for the frequency range around f~3 THz (the wavelength of radiation λ~100 µm) the distance L between the inhomogeneities can be of order of 10–50 µm, which is easily realizable. The interference of the edge magnetoplasmons coherently emitted by two contacts is illustrated in FIG. 4. The bays can be contacted as in FIG. 1b.

Edge magnetoplasmons, emitted by different bays, interfere with each other as illustrated in FIG. 5. FIG. 5a shows an example of constructive interference and FIG. 5b an example of destructive interference of edge magnetoplasmons excited by a couple of contacts placed at $(x, Y_1)=(0,0)$ mm and $(x, Y_2)=(0,1)$ mm. Parameters of the sample were taken to be close to those used in the experiments; the density, mobility, frequency and the distance between contacts are the same for both plots, only the values of the magnetic field B are different. The very large difference in the scales on the x and y axes (50 µm and 3 mm respectively) should be noted. The resulting interference pattern of the intensity of the edge magnetoplasmon field inside the device will be an oscillating function of the parameter qL∝ωLB∈/$n_s$. Measuring the period of these oscillations as a function of applied magnetic field B (as discussed in the next section), in a device with a fixed carrier density $n_s$, a fixed distance between the bays L, and in a given dielectric environment (fixed ∈), one can determine the frequency of the incident electromagnetic wave. Thus the device operates as a spectrometer.

It should be emphasized that the use of the interference of the excited edge magnetoplasmons is in principle similar to the conventionally employed mechanical interference schemes (with beam splitters, moving mirrors, et cetera). In both cases the interference of waves allows one to analyze the spectrum of the incident irradiation. A great advantage of the present teaching is that the interference occurs inside the miniature device, without any additional and cumbersome external mechanical interferometric arrangements. Instead of mechanically adjusting the distance between mirrors, in order to measure the frequency in the conventional methods, it is only necessary for realising the present teaching to adjust the magnetic field (or, alternatively, the carrier density) in a sample with a fixed distance between the bays. Physically, this essential difference arises as follows. In the conventional methods the interference is governed by the ratio L f/c of the distance L between mirrors to the wavelength of electromagnetic waves c/f, where c is the speed of light. There is no other value, except the length L, which can be varied in this ratio. In the present method, the interference is governed by the ratio L f/S of the distance L between the edge bays to the wavelength of the edge magnetoplasmons 2π/q=S/f, where S is the velocity of edge magnetoplasmons. The edge magnetoplasmon velocity S∝$n_s$/B is itself an essential function of the carrier density and the magnetic field, which allows easy control of the interference pattern. In addition, under typical experimental conditions, the edge magnetoplasmon velocity S is one to two orders of magnitude smaller than the speed of light c, which allows much shorter distances L to be used between the edge bays, than the distance between the mirrors in conventional techniques.

Figure 6A:
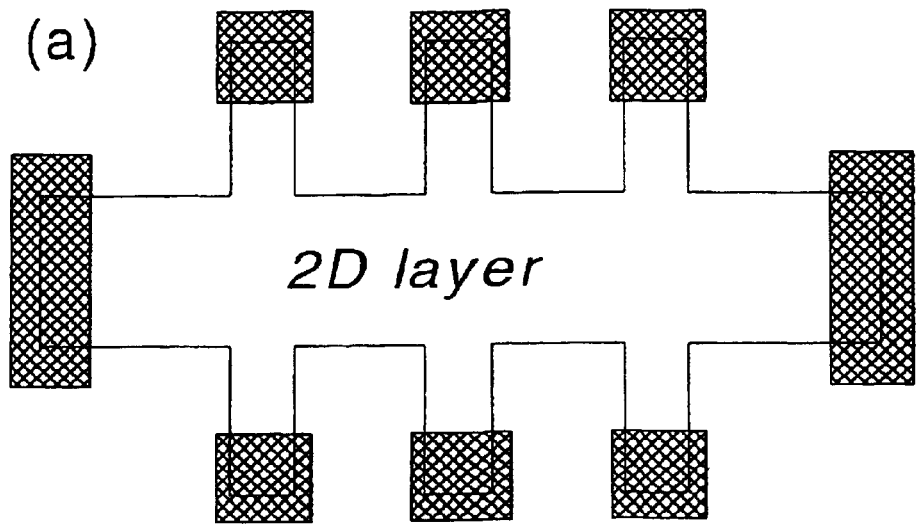
FIGS. 6a and 6b show examples of possible realizations of the proposed device: a standard Hall bar structure (FIG. 6a), and a Hall-bar-type structure with several additional intentionally introduced "inhomogeneities" (protrusions) of the boundary (FIG. 6b).
Figure 6B:
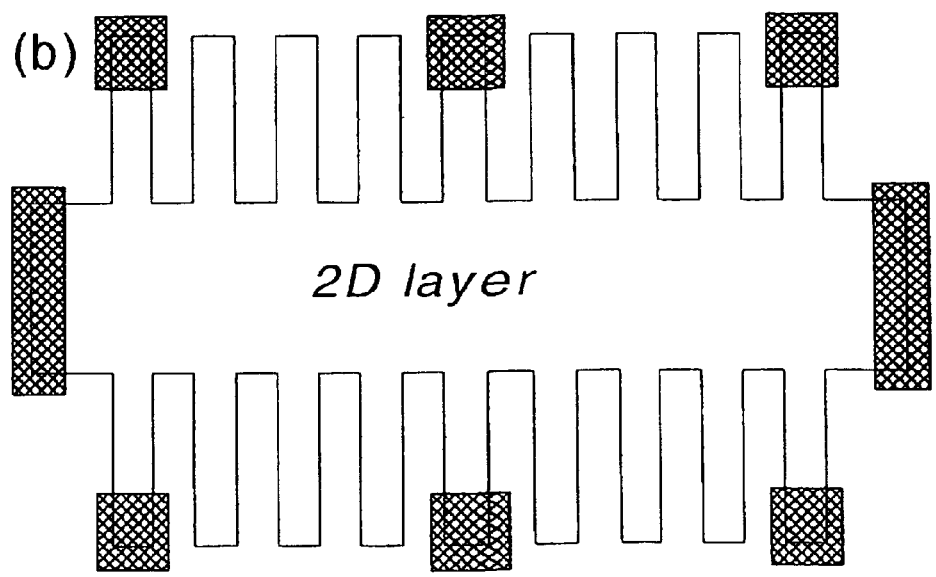

In a simple realization of the proposed method, two edge inhomogeneities are sufficient to obtain the interference pattern of edge magnetoplasmons and thus to measure the frequency of the incident radiation. In a more advanced technique, one can use a large number of equally spaced bays—a grating, or a superlattice of the bays, e.g. as shown in FIG. 6, in order to improve the quality of the measured interference picture and to increase the accuracy of measuring the frequency of radiation. Thus, FIG. 6 shows the following possible realisations: FIG. 6(a) a conventional Hall bar, FIG. 6(b) a Hall bar with several additional intentionally introduced bays along the edge, forming a grating, or a superlattice, for excitation of the edge magnetoplasmons. The present teaching includes both simple and advanced (grating or superlattice-type) forms of the edge inhomogeneities.

5. Rectification of the Edge-Magnetoplasmon Field: The Photovoltaic and Photoresistance Effects In the preceding discussion it has been shown that the interference of the edge magnetoplasmons, coherently emitted by different inhomogeneities, leads to a complicated, position and time dependent edge-magnetoplasmon field inside the device. In order to measure this field, it is sufficient to attach contacts to at least two edge inhomogeneities, as shown in FIG. 1b and as is usually done in conventional Hall-bar devices (additional tunnel-barrier elements can be optionally added in the contact regions as shown in FIG. 1c). Experiment shows that a dc potential difference, the photovoltage, develops between the pairs of potential contacts, attributed to non-linear behaviour in the device. One possible reason for this rectification is the non-linear current-voltage characteristics of the potential barriers at the interface between the quasi-two-dimensional charged layer and the contact or the tunnel-barrier (the contacts are known to be not ideally ohmic even at room temperatures), however the specific physical mechanism of this rectification process is not essential for the present teaching.

Figure 7:
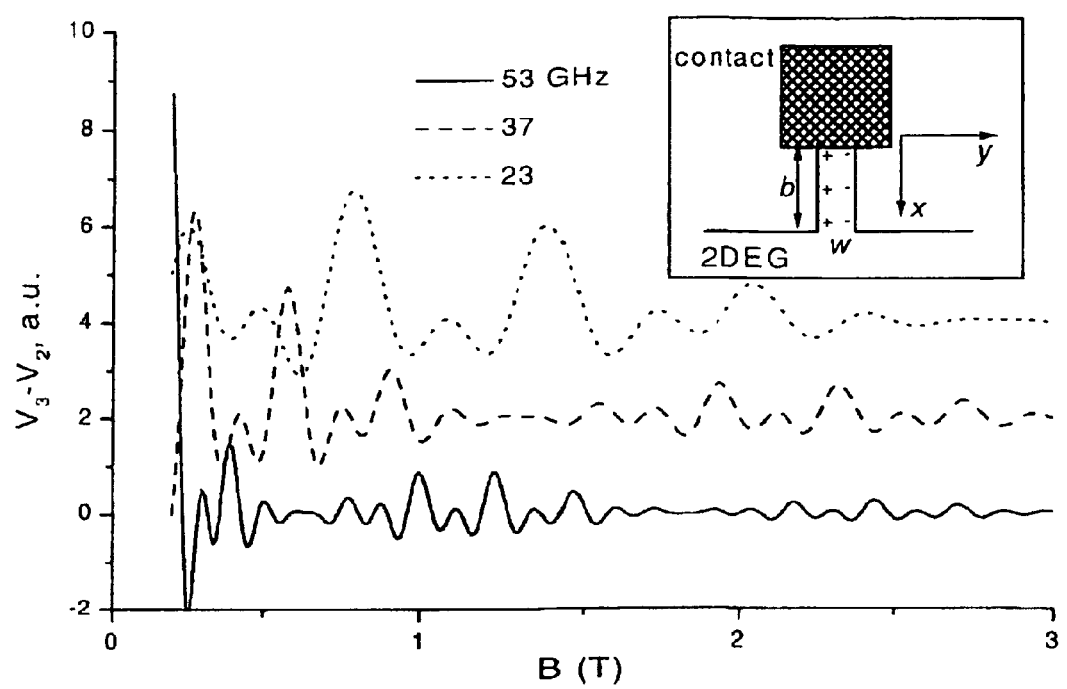
FIG. 7 shows an example of theoretically calculated photovoltage in a Hall-bar device, as a function of magnetic field, for several frequencies of electromagnetic radiation.

Because of the said interference of the edge magnetoplasmons, this photo-voltage will be an oscillating function of $\omega LB \in /n_s$. An example of such a photovoltage, calculated under realistic experimental conditions, is shown in FIG. 7. More specifically, FIG. 7 shows the calculated dc voltage between a pair of potential contacts in a 2DES with $n_s=2.5\times10^{11}$ cm$^{-2}$, a mobility $\mu=1.6\times10^6$ cm$^2$/Vs, distance between the contacts L=0.5 mm, and contact width w=0.1 mm. The three curves correspond to different microwave frequencies and are vertically shifted with a value of 2 for clarity. It is assumed that there are three potential contacts along the side of the Hall bar. The voltage shown develops between contacts 2 and 3 (edge magnetoplasmons propagate from contact 1 to contact 3). The inset illustrates schematically the distribution of microwave-induced charges near the contact regions. Measuring the period of these oscillations, as a function of magnetic field B, at a fixed density $n_s$ and fixed distance L, gives the information about the frequency of the incident electromagnetic radiation. Measuring the amplitude of these oscillations gives the information about the intensity of the incident radiation. Recording the photovoltaic effect thus represents a first method for detection and spectrometry of electromagnetic radiation in accordance with the present teaching.

The second method of detection and spectrometry of the electromagnetic radiation consists in measuring the photoresistance of the device under the influence of irradiation. For the same or similar physical reasons the photoresistance of the device, measured between different pairs of potential contacts, also oscillates as a function of $\omega LB \in /n_s$ and also enables the intensity and the spectrum of the incident electromagnetic radiation to be analyzed.

B. Experimental Results

B-periodic oscillations of both the photovoltage and the photoresistance, induced by incident microwave radiation and characterized by the above discussed dependencies on the charge carrier density and the distance between the edge inhomogeneities, have been experimentally observed. The experiment was performed on a quantum-well GaAs/AlGaAs heterostructure as shown in FIG. 15 with a single two-dimensional electron layer, processed into Hall-bar geometries with differing width (0.4 mm and 0.5 mm) of the device and different distances between adjacent potential probes L (1.6 mm, 0.5 mm, 0.4 mm and 0.2 mm). The density of electrons in the sample was about $3\times10^{11}$ cm$^{-2}$ and the low-temperature (4 K) mobility $\mu$ about $1.3\times10^6$ cm$^2$ Vs. The sample was placed in an oversized 16 mm waveguide at the maximum of the microwave electric field. Generators covered the frequency range from 12 GHz to 58 GHz, with the microwave input power up to 1 mW.

Figure 8A:
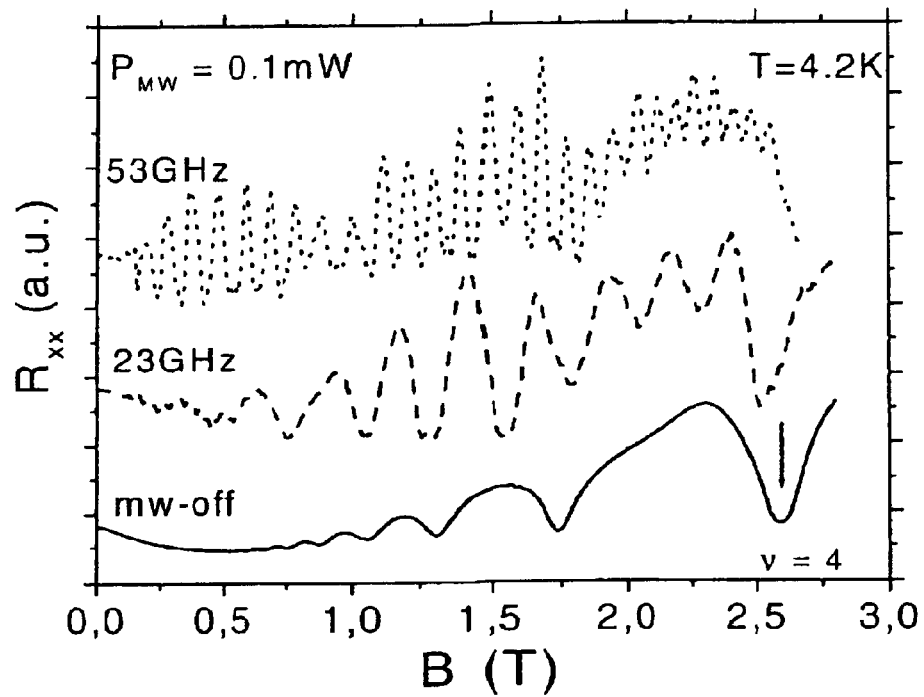
FIGS. 8a and 8b show experimentally measured dependencies of the microwave induced photoresistance, as a function of magnetic field, and for different microwave frequencies (FIG. 8a) and power levels (FIG. 8b).
Figure 8B:
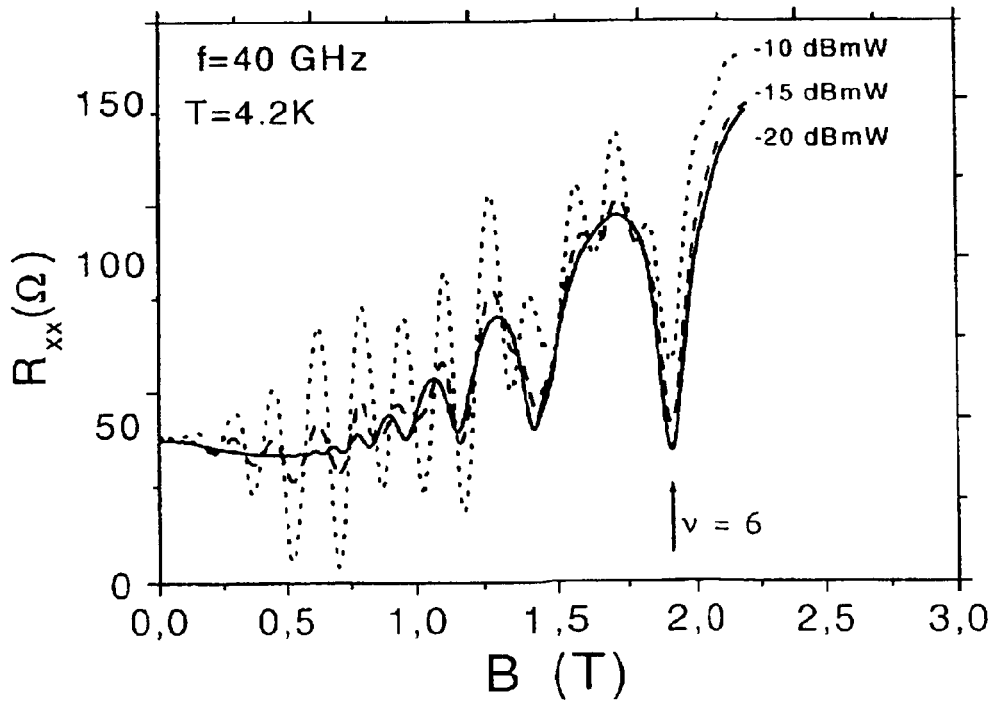

1. Microwave Induced B-Periodic Oscillations in the Photoresistance and the Photovoltage FIG. 8a shows the magnetic field dependence of the longitudinal resistance measured without and with microwave irradiation for frequencies of 23 and 53 GHz. Apart from the 1/B-periodic Shubnikov-de Haas oscillations, seen without microwaves, additional B-periodic oscillations emerge under incident microwave radiation. The period of these oscillations is inversely proportional to the microwave frequency. More specifically, FIG. 8a shows the longitudinal resistance $R_{xx}$ as a function of magnetic field B without microwaves (the lower curve) and in the presence of microwaves for two different frequencies at a temperature of 4.2 K. The arrow marks Landau-level filling factor ν=4. Without microwaves the $R_{xx}$ curve exhibits familiar 1/B-periodic Shubnikov-de Haas oscillations. FIG. 8b illustrates how these B-periodic oscillations develop with increasing microwave power, i.e. the evolution of $R_{xx}$ vs. B with microwave power $P_{\mu w}$ (from bottom to top: 10, 30, and 100 $\mu$W). The power level does not affect the period of the oscillations, but greatly influences the amplitude. FIG. 9 confirms the B-periodicity of the observed oscillations: the oscillation maxima have been assigned an integer index and their magnetic field position is plotted versus the index for various microwave frequencies. The electron density is equal to $2.61\times10^{11}$/cm$^2$. The B-periodic behaviour holds for a wide range of microwave frequencies (at least from 12 GHz to 58 GHz). FIG. 10 illustrates how the oscillation period $\Delta B$ depends on microwave frequency, as well as the electron density and the distance between potential probes. More specifically, FIG. 10a shows the period $\Delta B$ of the oscillations versus inverse microwave frequency for various electron concentrations. The distance between potential probes equals 0.5 mm. FIG. 10b shows $\Delta B$ versus inverse microwave frequency for different distances between potential contacts at fixed concentration $n_s=3.1\times10^{11}$ cm$^{-2}$. The data of FIG. 10 are approximately described by the formula $$\Delta B[T] = A \frac{n_s[10^{11} \text{ cm}^{-2}]}{L[\text{mm}] f[\text{GHz}]} \qquad (2)$$

with A close to unity. This agrees with the interpretation given above and formula (1).

The microwave induced oscillations in the photovoltage, in the absence of an externally imposed current, have also been observed: the voltage difference appears across any voltage contact pair along the side of the Hall bar. In this connection reference is made to FIGS. 11 and 12, with FIG. 11 showing microwave induced photovoltage $V_{xx}$ versus applied magnetic field for 40 GHz incident microwave radiation, $n_s=2.55\times10^{11}$ cm$^{-2}$ and FIG. 12 showing microwave induced photovoltage $V_{xx}$ versus applied magnetic field for 55 GHz incident microwave radiation, $n_s=2.55\times10^{11}$ cm$^{-2}$. The B-periodicity of the photovoltaic and photoresistance oscillations is identical as can be seen from FIG. 13 which shows the magnetoresistance $R_{xx}$ (measured with a sample current of 1 $\mu$A) and photovoltage $V_{xx}$ versus applied magnetic field for 40 GHz incident microwave radiation and $n_s=2.75\times10^{11}$ cm$^{-2}$.

Polarization, Power and Temperature Dependencies of the Photoconductance and Photovoltaic Effects At low microwave frequencies, where the waveguide used to irradiate the device with electromagnetic radiation only supports a single mode, the influence of the microwave polarization has been investigated. Both for the photoconductance and the photovoltaic effect, the amplitude of the oscillations was far stronger for a microwave electric field perpendicular to the current direction. For the photoconductance effect a threshold behaviour as a function of microwave power was observed. The threshold power value is lower for microwave radiation polarized perpendicular to the long direction of the Hall bar. The oscillation period was independent of temperature T, and the amplitude of the photoconductance oscillations only weakly drops upon increasing T from 1.5 to 10 K.

For the photovoltaic effect, the microwave power and the temperature dependencies of their amplitude were different. The amplitude of the photovoltaic oscillations is linear in the microwave power without a threshold and saturated at a value of approximately 2 mV for 0.1 mW of power. This value is close to the threshold power of the photoresistance oscillations. In addition, the photovoltaic effect was found to be even less sensitive to temperature and drops only by one order of magnitude when raising the temperature up to 80 K. This can be seen from FIG. 14 which shows the microwave induced photovoltage $V_{xx}$ versus applied magnetic field for 49 GHz incident microwave radiation, $n_s=2.75\times10^{11}$ cm$^{-2}$ and at low (4 K) and high (80 K) temperatures.

The spectral resolution of the device derived from direct measurements was about 1–2 GHz. In the experiment for the frequency range of about 20–50 GHz about 20–40 oscillations were observed. This gave a Q-factor and spectral resolution of about 1–2 GHz for the specific device used in these experiments.

Experiments have been done with conventional Hall-bar devices, containing source and drain contacts, and three pairs of potential contacts along the side boundaries of the device as shown in FIG. 6a, as well as with specially designed devices, containing, in addition to the three pairs of potential contacts, a number of intentionally introduced protrusions along the side boundaries of the device as shown in FIG. 6b. The observed oscillations corresponded to the distance between the protrusions, in accordance with the interpretation given above.

Experiments have thus demonstrated that the proposed method works. It allows both the intensity and the frequency of the microwave radiation at f up to ~60 GHz to be measured, at temperatures up to 80 K. No principal difficulties are expected in increasing the frequency up to 1–3 THz. Moreover, as the damping of the edge magnetoplasmons decreases with increasing frequency, it is anticipated that the effects will even be easier to measure at higher frequencies. In addition, as can be seen from Eq. (2), the period of microwave induced oscillations decreases with increasing frequency, which facilitates measurements and improves the accuracy of determination of the frequency. Table I gives the estimates, obtained from Eq. (2), for the period of B-periodic microwave induced oscillations for different representative frequencies and different geometrical parameters of the device. One sees that by using devices with different distance between potential contacts L, one can choose, for any desired frequency range, the most convenient oscillation periodicity to obtain an accurate measurement of the frequency. An additional parameter for controlling the period $\alpha$B is the use of devices with different charge carrier density $n_s$ which can be easily varied from, say, $1\times10^{11}$ cm$^{-2}$ (in a single quantum well) up to $1.5\times10^{12}$ cm$^{-2}$ (for instance, in multiple quantum well systems with five quantum wells).

The following table shows estimates of the period of the microwave induced B-periodic oscillations of the photoconductance and the photovoltage for a charge carrier density of $n_s=3\times10^{11}$ cm$^{-2}$.

TABLE I

| | | | | | |
|---|---|---|---|---|---|
| L = 500 $\mu$m | f = 20 GHz $\Delta B \approx 0.3$ T | f = 100 GHz $\Delta B \approx 60$ mT | f = 1 THz $\Delta B \approx 6$ Motorraum | f = 3 THz $\Delta B \approx 2$ mT | f = 10 THz $\Delta B \approx 0.6$ mT |
| L = 50 $\mu$m | f = 20 GHz $\Delta B \approx 3$ T | f = 10 GHz $\Delta B \approx 0.6$ T | f = 1 THz $\Delta B \approx 60$ Motorraum | f = 3 THz $\Delta B \approx 20$ mT | f = 10 THz $\Delta B \approx 6$ mT |
| L = 10 $\mu$m | f = 20 GHz $\Delta B \approx 15$ T | f = 100 GHz $\Delta B \approx 3$ T | f = 1 THz $\Delta B \approx 0.3$ T | f = 3 THz $\Delta B \approx 0.1$ T | f = 10 THz $\Delta B \approx 30$ mT |

Turning now to the further FIGS. 15 to 39 some examples will be given for practical ways of realising the present invention.

With reference first of all to FIGS. 15 and 16 there is shown a first way of realising a 2D charge carrier layer in the form of an electron layer.

First of all it is necessary to grow a semiconductor structure which provides for the containment of electrons in the form of a 2DEG, i.e. a two-dimensional electron gas.

The semiconductor structure comprises in this example a GaAs substrate 10, typically with a thickness of 0.3 to 0.5 mm (however, this is not critical). A GaAs buffer layer 12 is grown on the GaAs substrate and is followed by a superlattice structure 14 comprising alternating layers of AlGaAs and GaAs, with the AlGaAs layers typically being 7 nm thick and GaAs layers typically being 3 nm thick. The total thickness of the buffer structure 12, 14 typically amounts to 1 $\mu$m, however, this is again not critical. The idea is to prevent impurities from the GaAs substrate migrating into the active part of the device. The active part of the device comprises the layer 16 of GaAs (intrinsic material) which is followed by an intrinsic layer 18 of AlGaAs. After the intrinsic layer 18 has been grown it is followed by a silicon-doped AlGaAs layer 20 and a capping layer 22 of GaAs. If it is desired to change the density of electrons within one device, one can place an additional semitransparent conducting layer (not shown on the Figure) on top of the capping layer. The semitransparent conducting layer serves as a so-called top-gate: by applying a dc voltage between this layer and the 2DEG one can change the density of 2D electrons in the device. A semitransparent conducting top-gate for changing the density of the 2D electrons within the device by applying the voltage can be also added to systems shown in FIGS. 17 and 20 below. Alternatively, an additional conducting layer, separated by at least one barrier from the 2DEG, may be inserted in the layer structure of FIGS. 15, 17 and 20 below the 2D charge carrier layer (also not shown in the figures). It serves as a back-gate for changing the density of charge carriers in the 2DEG: applying a voltage between this back-gate and the 2DEG one can change the density of 2D electrons in the 2DEG. The structure is, for example, grown by molecular beam epitaxy, as are all other structures described here. The conduction band scheme for the structure of FIG. 15 is shown in FIG. 16. It can be seen that the interface between the undoped AlGaAs layer 18 and the undoped GaAs layer 16 forms a potential well 24. The potential well 24 has a quantised energy level 26 for electrons which are induced into the potential well by the silicon donor atoms provided in the layer 20. The electrons are thus sharply localised in the potential well 24 and this results in the two-dimensional electron gas illustrated as the layer 26 in FIG. 15.

As can be seen from the entry in FIG. 15, this two-dimensional electron gas is localised in the GaAs in a layer having a thickness of approximately 5–10 nm. Although this is a very thin layer it is probably better described as a quasi two-dimensional electron gas rather than a strict two-dimensional electron gas which would have zero thickness.

It can also be seen from the entries in FIG. 15 that the layers 18, 20 and 22 provided on top of the GaAs layer 16 have a total thickness typically in the range from 35 nm to 250 nm, with the relative proportions being as shown in the drawing. These dimensions are, however, not critical. The GaAs layer 16 typically has a thickness of approximately 1 $\mu$m, but again this is not critical.

Turning now to FIG. 17 there can be seen an alternative way of realising a two-dimensional electron gas. The structure of FIG. 17 is similar to that of FIG. 15 and the layers which are common to both structures have been given the same reference numerals.

It can be seen that the layer 16 of GaAs has been reduced in this structure to a thin layer having a thickness of ~10 nm and that it is sandwiched between two layers 18 of intrinsic AlGaAs. These two layers 18 are in turn sandwiched between two layers 20 of AlGaAs doped with silicon.

The conduction band diagram for this structure in the vicinity of the thin intrinsic GaAs layer 16 is shown in FIG. 18. The thin layer 16 of intrinsic GaAs forms the quantum well 24 with a quantised energy level 26 in which electrons are localised. The electrons are induced by the presence of the silicon donors in the two layers 20.

FIG. 19 now shows how the semiconductor structure of FIG. 15 or FIG. 17 has been patterned in the shape of a Hall bar in order to provide a semiconductor structure which can be used for the purposes of the present invention.

More specifically, the structure of FIG. 15, or of FIG. 17, has been etched from the top in FIG. 15 (or FIG. 17) down to the GaAs layer 16 of FIG. 15 or down to the AlGaAs layer 18 beneath the GaAs layer 16 in FIG. 17, so that it has generally the shape of an H in plan view, with the crossbar 32 of the H being relatively broad relative to the "vertical" arms (34, 38, 34', 38') and with the crossbar being extended beyond the vertical arms of the H, so that the shape shown in perspective view in FIG. 19 results.

The Hall bar schematically shown in FIG. 19 comprises the 2DEG layer 26, illustrated by a thick black line in FIG. 19, sandwiched between the intrinsic GaAs layer 16 of FIG. 15 (shown below the 2DEG 26) and the layer system 18, 20, 22 (shown above the 2DEG 26 in FIG. 15).

Not shown in FIG. 19 but actually present beneath the Hall bar is the bottom part of the semiconductor structure of FIG. 15 comprising the layers 10, 12, 14 and the remainder of layer 16 and these layers are rectangular in plan view as shown in FIG. 15, because the etching process has been restricted to the top part of the layer 16.

Also not shown in FIG. 19 is a semitransparent conducting layer on top of the whole structure (the top-gate) or a conducting back-gate layer below the 2D charge carrier layers, which can be (but is not necessarily) added to the system in order to provide the opportunity to change the charge carrier density in the device applying a voltage between the top-gate or the back-gate and the 2DEG.

When the 2DEG is realised using the semiconductor structure of FIG. 17 then the layer indicated as layer 16 in FIG. 19 would in fact comprise the layer 18 shown in FIG. 17 beneath the quantum well layer 16.

In the arrangement of FIG. 19 contacts 46, 48 have been provided to the "uprights" 34 and 38 of the Hall bar at the "top" ends of the uprights and further contacts 46' and 48' have been provided to the "bottom" ends 34' and 38' of the "uprights", although these contacts are not exploited in this particular embodiment. In addition, contacts 54 and 56 are provided to the extensions 42 and 44 respectively of the crossbar 32 and are connected into a circuit 58 which drives a small current I between the two contacts 54 and 56, if photoresistance measurements are to be made. For photovoltaic or photocurrent measurements, no drive current is needed, and circuit 58 can be omitted.

Also shown in FIG. 19 is a circuit 59 for generating a magnetic field that may be tunable in magnitude and which extends perpendicular to the 2DEG 26, for example in the direction of the arrow 61, or has at least a field component extending in the direction of the arrow 61 (or in the opposite direction thereto).

If electromagnetic radiation now falls on the device of FIG. 19 in the direction of the arrow 60, or in any other direction with the electric field of the electromagnetic wave having at least a component parallel to the 2D charged layer, then this will result in a photovoltage V being induced between the contacts 46 and 48 due to the edge magneto-plasmons. This photovoltage V can be measured and provides information on the presence of electromagnetic radiation 60. As an alternative to measuring the photovoltage V between the contacts 46 and 48 the photoresistance between the contacts 46 and 48 can also be measured. Using the contacts 54 and 56 for passing a current through the device has the advantage that there is no current flowing between contacts 46 and 48, and as a result an uninteresting contribution (so called "contact resistance") from the interface between the potential contacts and the 2D charge layer itself is avoided.

As seen from equation 2 and Table I, sweeping the magnetic field B over a range from 0 T to 3 T using the circuit 59, for example by varying the current through the coil, while holding the charge carrier density $n_s$ constant, the photovoltage will follow a plot similar to that of FIG. 7 and FIG. 8a, with about 10 oscillations in the interval 0–3 T, if the frequency is 20 GHz, distance between contacts 0.5 mm, and the density is $3 \times 10^{11}$ cm$^{-2}$, (the period $\Delta B = 0.3$ T, Table I) and with about 50 oscillations in the interval 0–3 T, if the frequency is 100 GHz for the same distance L and the same density (the period $\Delta B = 0.06$ T, Table I). Measuring the period of oscillations as a function of sweeping magnetic field, one can thus determine the frequency of the incident radiation. Moreover, the intensity of the incident radiation can be determined from the amplitude of the signal, as shown in FIG. 8b.

Alternately the magnetic field B can be held constant and the charge carrier density in the 2D charge carrier layer can be varied by varying the dc voltage between the semitransparent conducting top-gate and the 2DEG or between a conducting back-gate and the 2DEG. Again curves are obtained similar to those of FIG. 8a, FIG. 8b and FIG. 7 again allowing the frequency of the incident radiation and the amplitude thereof to be measured. The arrangement with sweeping magnetic field and a constant 2D charge carrier density (in one device realization) is more favourable because the top- or back-gate will partly screen (reflect) the incident electromagnetic radiation. An advantage of an additional dependency of the oscillation period on the 2D charge carrier density in the device can be fully used by using a plurality of devices with distinct but constant densities.

Similar results can be obtained if the photocurrent or the photoresistance is measured between the contacts 46 and 48 instead of the photovoltage.

In all the above measurements the distance L is of course fixed for one physical realisation of the detector.

Turning now to FIG. 20 there can be seen another way of realising the semi-conductor structure necessary for the device of the present invention. In this case the structure is a double quantum well structure, which has two 2DEGs rather than just one, as in the embodiments of FIG. 15 and 17. The layer system is similar to that of FIG. 17 and therefore the same reference numerals are used to describe the layers as were used in FIG. 17. It can readily be seen from the band diagram of FIG. 21 that the shape of the conduction band essentially repeats the shape of the conduction band of FIG. 18 (for the semiconductor structure of FIG. 17).

Moreover, it will be apparent to a person skilled in the art that the double quantum well structure of FIG. 20 could be replaced by a superlattice structure with alternating thin layers of GaAs and AlGaAs, so that a plurality of 2DEGs is present.

In all the FIGS. 15 to 39 the same reference numerals will be used to designate elements having the same shape and/or function, and will be supplemented with an index ' or ", or ''', if necessary, to distinguish between a plurality of elements having the same function. It will be understood that the description given for elements having a particular reference numeral in one figure also applies for elements having the same reference numerals in other figures, unless something is stated to the contrary.

Turning now to FIGS. 22 to 39 a variety of different schemes is shown for the shape of the 2D charge carrier layer and the contacting of this layer.

The simplest example is shown in FIG. 22 where the 2D charge carrier layer 26 is rectangular in shape and is provided with just two contacts 46 and 48 spaced apart by a distance L.

In this embodiment the edge of the 2D charge carrier layer 26 between the contacts 46 and 48 is straight, this is the simplest conceivable detector configuration, and it is the contacts 46 and 48 which are responsible for the generation of the edge magnetoplasmons. Moreover these contacts allow to measure at least one of the photo-voltage and photocurrent and photoresistance.

Turning now to FIG. 23 there can be seen an alternative embodiment in which the edge 62 of the 2D charge carrier layer 26 includes first and second projections 34, 38 and the first and second contacts 46, 48 are in this case respectively provided at said first and second projections. The projections 34, 38 can be additionally supplied by tunnel-barrier elements, as shown in FIG. 1c, for additional control of nonlinear behaviour of the contact regions. The same is valid for all similar elements in the subsequent figures.

The device of FIG. 24 is essentially the same as that of FIG. 23 except that the distance L' between the first and second projections 34 and 38 is substantially larger than L in FIG. 23. Having regard to the equation 2, this signifies that the device of FIG. 24 is designed to detect a lower frequency than the device of FIG. 23.

FIG. 25 shows a device similar to that of FIG. 23 with the first and second projections 34 and 38 being separated by the same distance L. The device of FIG. 25, however, also includes two further contacts 54 and 56 to the 2D charge carrier layer 26 and in practice a current is allowed to flow through an external circuit, such as 58 in FIG. 19 and between the contacts 54 and 56. Passing the external current between contacts 54 and 56 while measuring the photoresistance between contacts 46 and 48 allows one to avoid the influence of the undesired contact resistance, as described with respect to the embodiment of FIG. 19.

Figure 26:
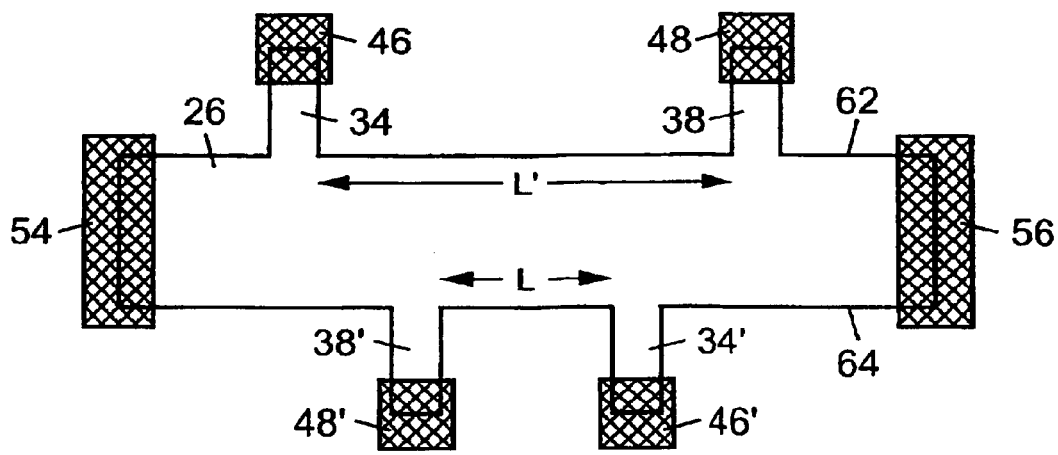

Turning now to FIG. 26 there can be seen a device which is essentially a combination of the device of FIG. 25 with that of FIG. 24.

Here, first and second projections 34 and 38, with contacts 46 and 48, are provided on one edge 62 of the 2D charge carrier layer 26, whereas third and fourth projections 34' and 38', with contacts 46' and 48', are provided at a second edge 64 of the 2D charge carrier layer 26, the second edge 64 being parallel to the opposite edge 62 in this example. Again, two further contacts 54 and 56 are provided to the 2D charge carrier layer 26 and will be connected in practice to an external circuit such as 58 to avoid the influence of the contact resistance when measuring the photoresistance between the contacts 46 and 48 or the contacts 46' and 48'.

This embodiment has the advantage that the effective separations L and L' between the respective pairs of contacts 46, 48 and 46', 48' are different, so that the same device can be used to detect electromagnetic radiation in different frequency bands, by taking measurements between contacts 46 and 48 for one frequency band and between contacts 46' and 48' for a second frequency band.

Figure 27:
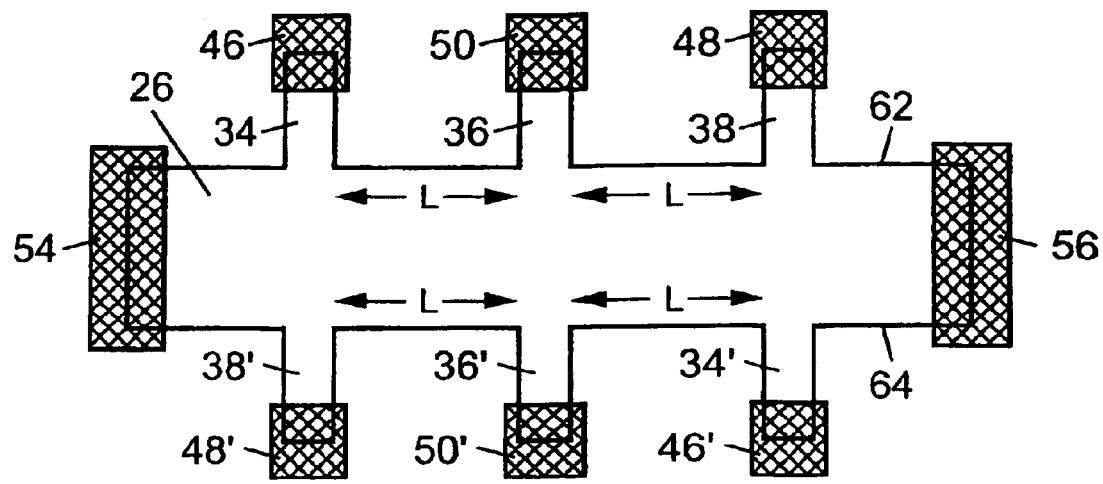

Turning now to FIG. 27 there can be seen an embodiment with three projections 34, 36, 38 and 34', 36' and 38' from each of two opposite edges 62 and 64.

It will be noted that the spacing between the projections 34 and 36 is equal to L as is the spacing between the projections 36 and 38, between the projections 34' and 36' and between the projections 36' and 38'. Thus, any of the pairs of contacts 46–50, 50–48, 46'–50', and 50'–48' which are spaced apart by the distance L can be used to determine the presence of radiation, its frequency and intensity. The amplitude of the photovoltage/photocurrent/photoresistance oscillations is expected to increase the more contacts are present.

In all the previous embodiments described with reference to FIGS. 22 to 27, the edge 62, 64 between the contacts 46,48 or between the projections, such as (34, 38), (34', 38'); (34, 36), (36, 38), (34', 36') and (36', 38'), can be considered to be straight edges.

Figure 28:
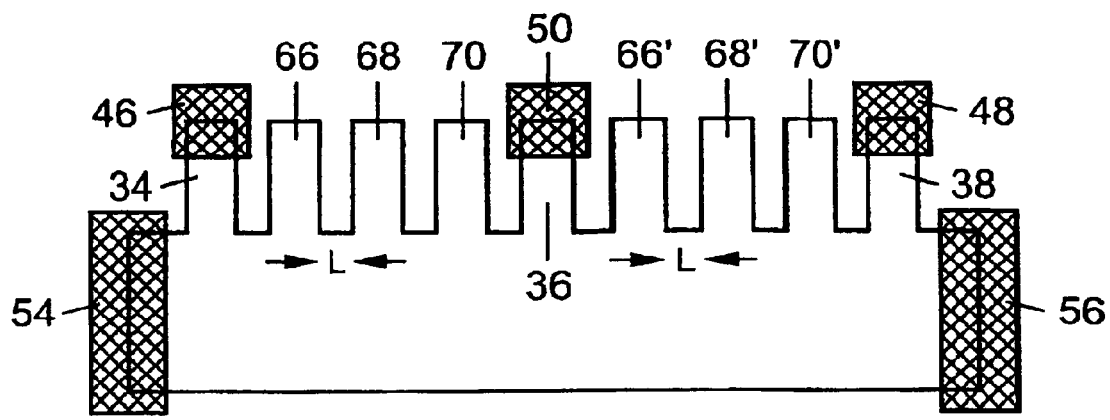
Figure 29:
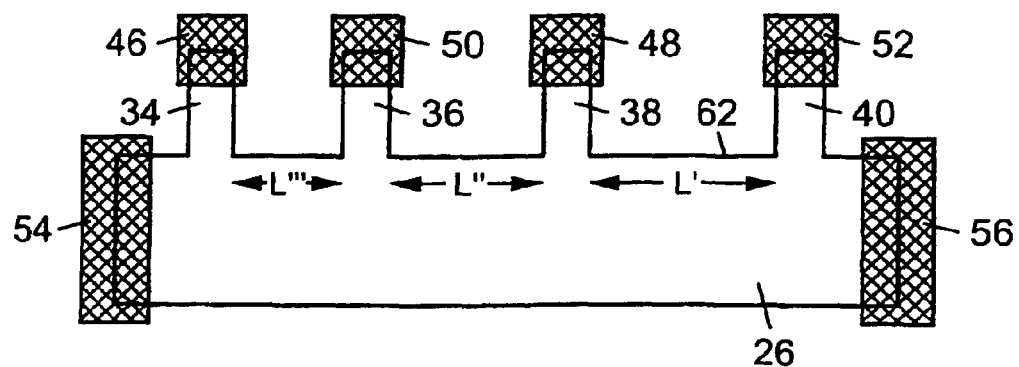

FIG. 28 shows that this is not essential. Here, the edge present between the projections 34 and 36 and between the projections 36 and 38 has the shape of a rectangular wave with further projections. The effect of these further projections 66, 68, 70, 66', 68', 70' is to enhance the generation of edge magnetoplasmons and to reduce the effective distance between the projections 34, 36 and 36, 38 by a number equivalent to the number of intermediate projections. The effective length L is now the distance between adjacent projections, so that the frequency range which the device is able to detect is correspondingly modified. The information about the frequency and the amplitude of the incident electromagnetic radiation will now be contained in the signal detected between the contacts 46 and 50, in the signal detected between contacts 50 and 48, as well as in the signal detected between the contacts 46 and 48.

It can be seen from FIG. 28 and from the preceding Figures that the width of the gap between adjacent projections has been kept constant. This is, however, not necessarily the case as shown in the example of the embodiment of FIG. 29. Here, different spacings are present between successive first, second, third and fourth projections 34, 36, 38 and 40 provided at the edge 62 of the 2D charge carrier layer 26.

Figure 30:
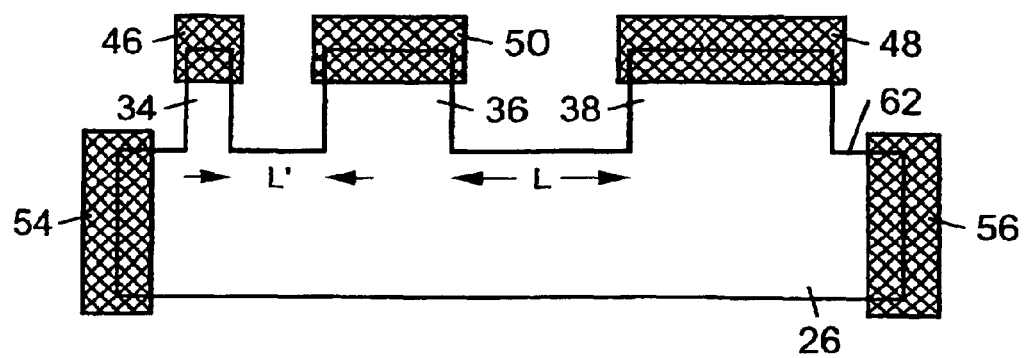

In all the foregoing embodiments the projections, such as 34, 36, 38, 40 have had a constant and identical width. This is, however, not necessary. FIG. 30 shows a device where the three projections 34, 36 and 38 have different widths and wherein the effective spacing L between the pairs of contacts 50 and 48 differs from the effective spacing L' between the pair of contacts 46 and 50.

Figure 31:
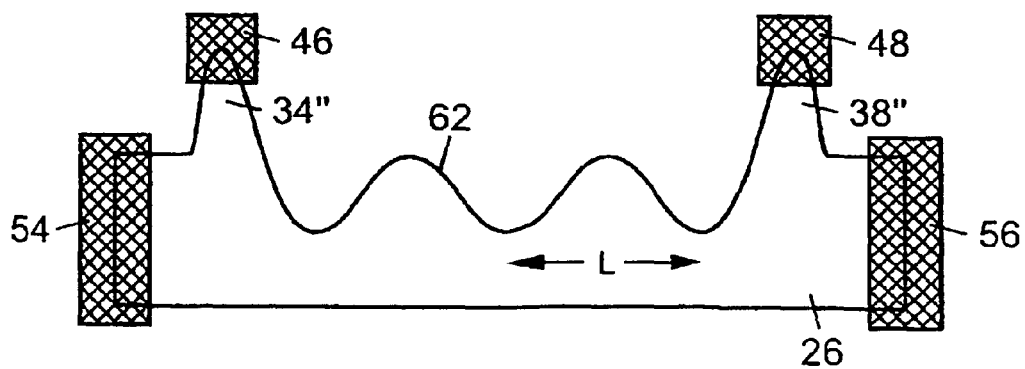

In all previous embodiments the edge 62, 64 of the charge carrier layer 26 has either been straight between adjacent projections, such as 34, 36, 36, 38 and 38, 40, or has included a regularly repeating structure, such as the projections 66, 68, 70, 66', 68', 70', in the device of FIG. 28. The inhomogeneities at the edges 62 and/or 64 of the charge carrier layer 26 do not, however, have to be formed by straight lines or by regularly repeating structures. Instead, a wavy shape for the edge 62 also gives rise to inhomogeneities and FIG. 31 gives one example for an embodiment in which the inhomogeneities at the edge 62 are formed by a wavy shape of the edge. In the embodiment of FIG. 31 the wavy shape is regularly repeating with a periodic length of L which is the effective distance for the measurement of the frequency. However, the wavy shape of the edge does not have to be regular in shape or spatial periodicity.

Figure 32:
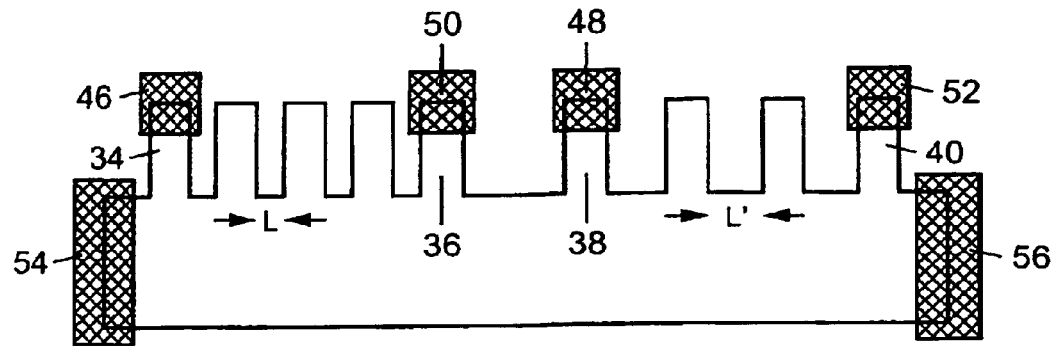

FIG. 32 shows an embodiment which corresponds largely to that of FIG. 28, but which has a different number of projections between the first pair of contacts 46 and 50 and between the second pair of contacts 48 and 52. Hence, the effective distance L between the contacts 46 and 50 differs from the effective distance L' between the contacts 48 and 52. The larger distance is more suitable for detecting low frequency radiation whereas the smaller distance is more appropriate for detecting high frequency oscillations.

In all the preceding embodiments of FIGS. 22 to 32 the inhomogeneities at the edge 62 or 64 of the semiconductor structure have been formed by projections from this edge.

Figure 33:
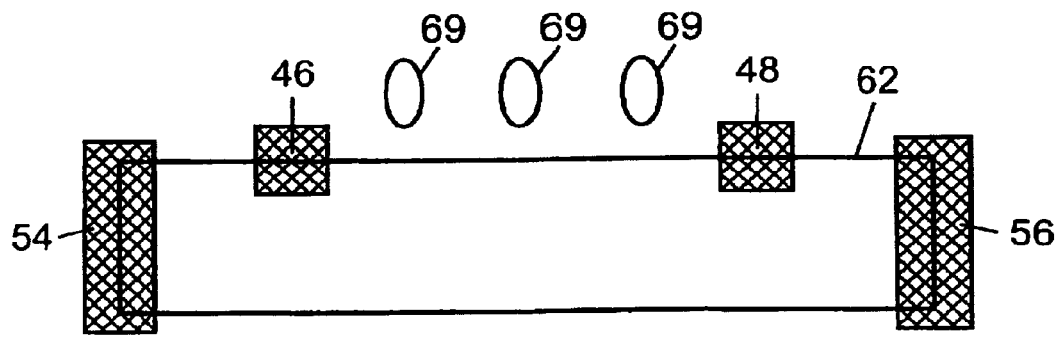

FIG. 33 shows that the inhomogeneities can, however, also be formed in a different way, in this case by one or more islands 69 of a 2D charge carrier layer dispersed apart between the first and second contacts 46 and 48 and generally opposite the edge 62. The separation between adjacent pairs of islands of the 2D charge carrier layer determines the effective frequency range which can be measured using this embodiment.

Figure 34:
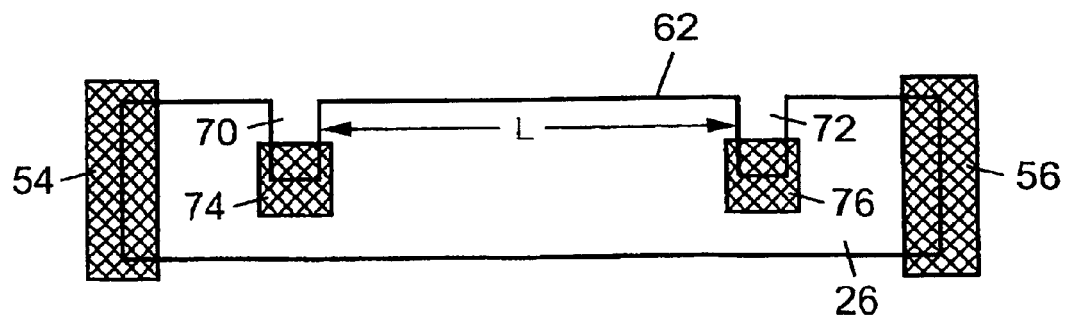

In previous embodiments the modulation of the edge of the 2D charge carrier layer has been described in terms of projections from the edge of the layer. It is, however, not necessary for inhomogeneities to be produced at the edge 62 or 64 of the 2D charge carrier layer by projections, they could instead be provided by indentations 70, 72, such as are shown in the embodiment of FIG. 34. It will be noted that the 2D charge carrier layer is contacted in this embodiment by contacts 74, 76 to the indentations in the edge 62 of the 2D charge carrier layer. Again, these indentations are separated by the effective distance L.

Figure 35:
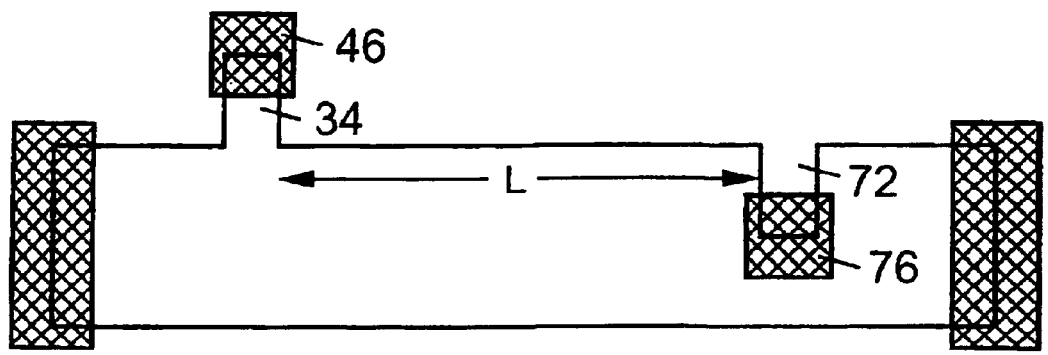
Figure 36:
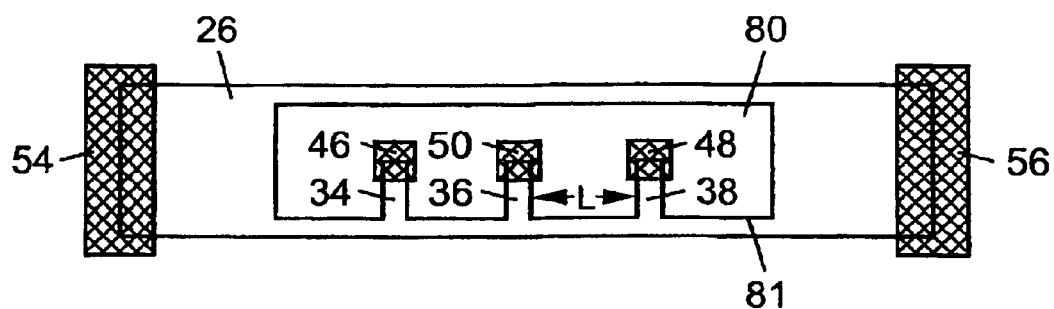

Also it should be noted that the inhomogeneities at the edge of the 2D charge carrier layer may not be formed by only projections or only indentations. FIG. 35 shows a device where the edge 62 of the 2D charge carrier layer 26 is provided with one projection 34 and one indentation 72, with the 2D charge carrier layer being contacted by contacts 46 and 76 to the projection 34 and to the indentation 72 respectively. In this embodiment the effective distance L between the projection 34 and the indentation 72 is the same as the effective distance L between the indentations 70 and 72 in FIG. 34.

In all the previous Figures the projections or indentations have been provided at an outer edge 62 or 64 of the 2D charge carrier layer. They can, however, be realised differently as shown, for example, in the device of FIG. 36. Here, the 2D charge carrier layer 26 has a central rectangular aperture 80 and the projections 34, 36, and 38 project inwardly from the 2D charge carrier layer into this aperture 80 at the edge 81. Respective contacts are provided to the projections as indicated as 46, 48 and 50.

It should be noted that the edge of the charge carrier layer need not necessarily take the form of projections into the aperture 80 of the 2D charge carrier layer but could also take the form of indentations of the edge 81 of the aperture (not shown in the drawing). Moreover, all the different topographies discussed above could also be adopted in the device of FIG. 36 and realised with respect to the edge 81 of the 2D charge carrier layer 26 defining the aperture.

Although the previous embodiments have all been based on a generally rectangular shape of the 2D charge carrier layer there is no restriction to such a shape and the shape of the outline of the 2D charge carrier layer, or an aperture defined with the 2D charge carrier layer, can be chosen at will.

Figure 37:
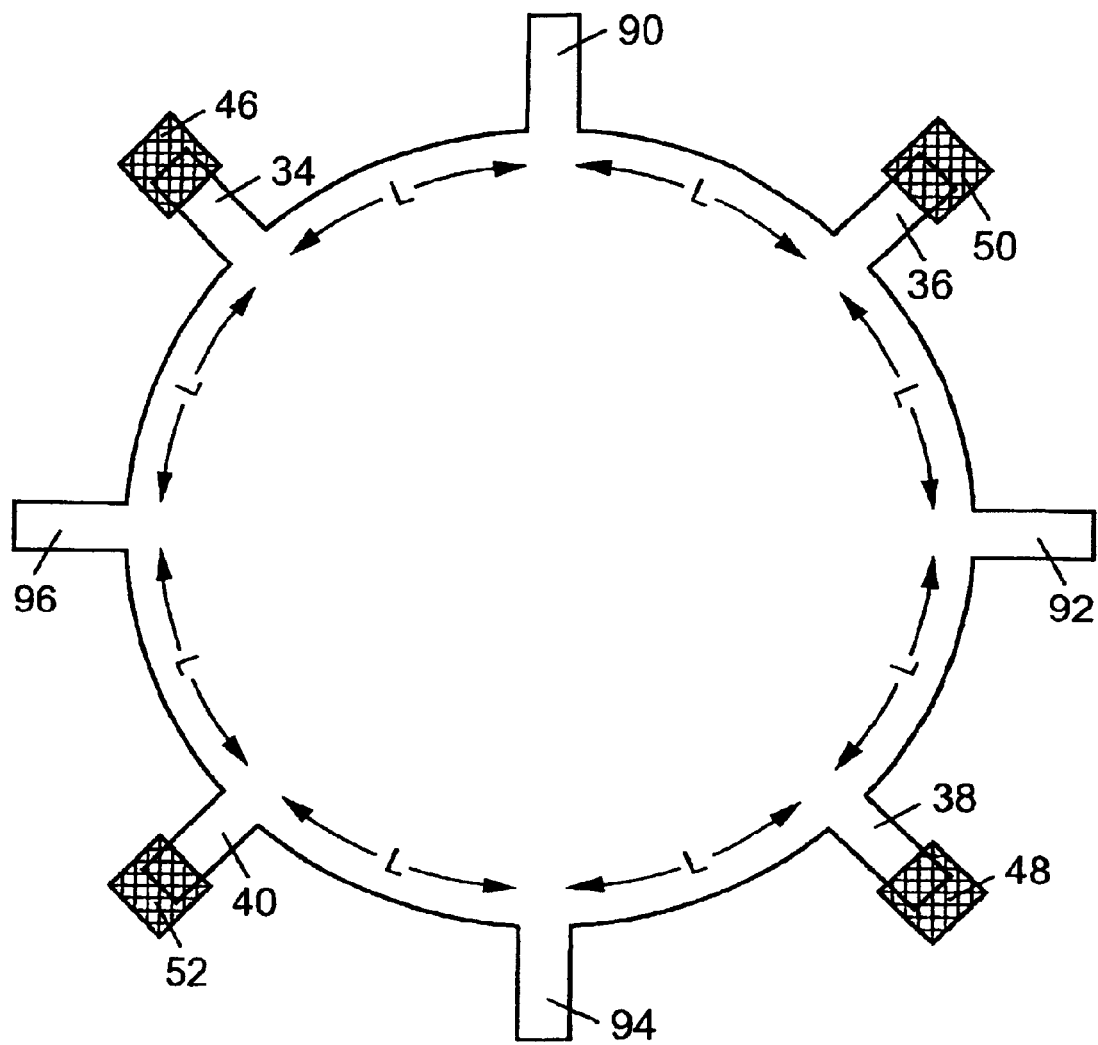

FIG. 37 shows, for example, a 2D charge carrier layer realised in the form of a circle or disk with projections extending from it. In this case there are four projections 34, 36, 38 and 40 which are provided with contacts and one intermediate projection 90, 92, 94, 96 is respectively provided between each pair of projections (34, 36); (36, 38); (38, 40) and (40, 34) to which contacts are provided. In this case the effective distance between each respective pair of contacts (46, 50); (50, 48); (48, 52) and (52, 46) is equivalent to L as a result of the presence of the projections 90, 92, 94, 96. The projections do not need to be spaced at equal angles around the centre of the disk, and there can be any number of projections or indentations between respective pairs of contacts. The topography of the edge between adjacent pairs of contacts can also be varied as desired. Topographies may be chosen on the basis of the examples given previously.

Figure 38:
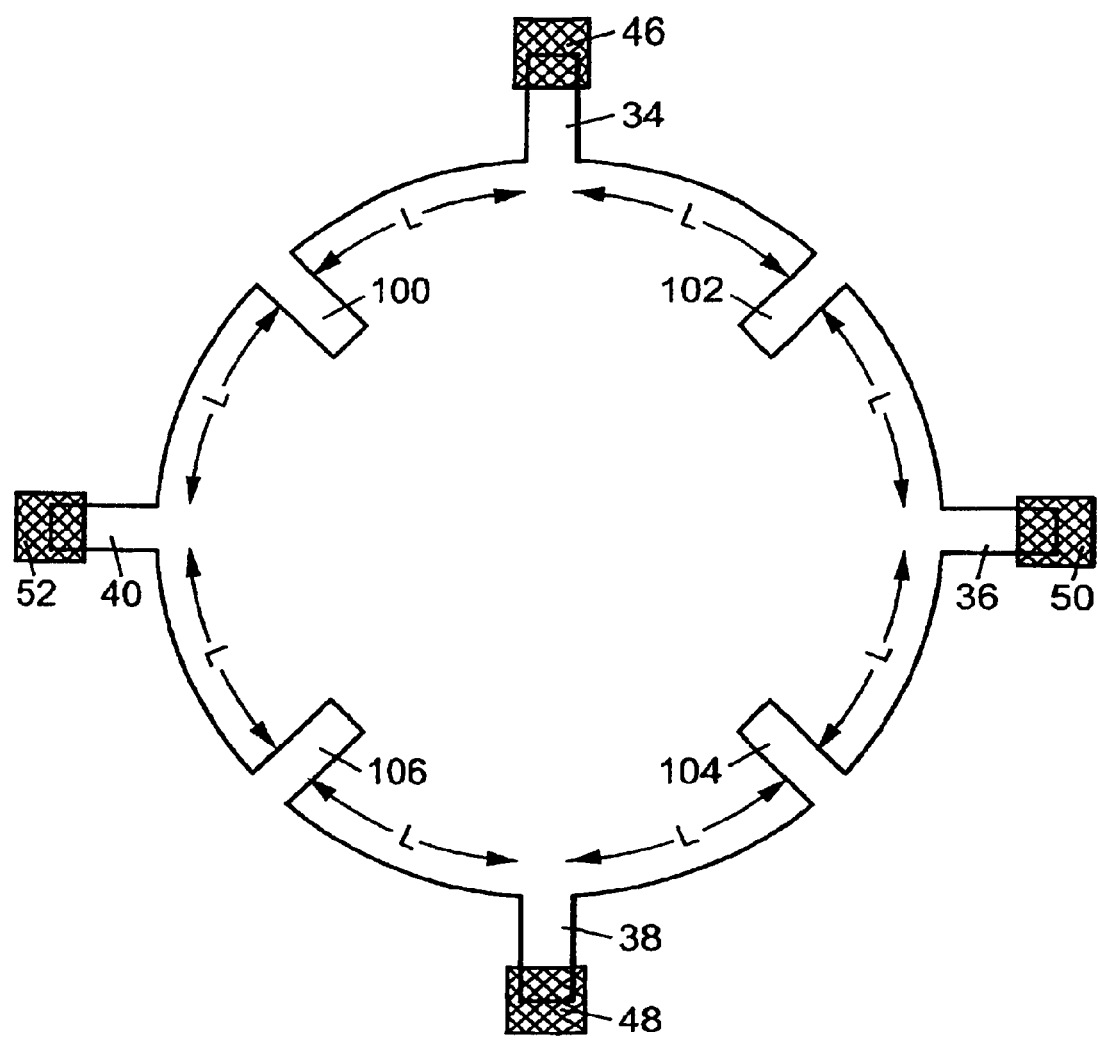

By way of a further example, FIG. 38 shows an embodiment similar to that of FIG. 37, but in which the projections 90, 92, 94 and 96 have been replaced by indentations 100, 102, 104 and 106. The effective separation between adjacent pairs of contacts (46, 50); (50, 48); (48, 52) and (52, 46) is again equal to L, so that the detector of FIG. 38 is configured for the same frequency range as the detector of FIG. 37.

FIG. 39 shows that the disk can also be realised as a so-called Corbino disk, i.e. a circular disk with an aperture at the centre. In this case the contacts 46, 50, 48 and 52 to the outer edge of the disk are realised in precisely the same way as in the circular disk in FIG. 38 whereas the contacts 46', 48' to the inner edge of the Corbino disk, i.e. to the edge of the circular aperture in the disk of FIG. 39 are realised with a different effective separation between the two contacts shown, so that this device can be used to analyze the spectrum of incident radiation in two different frequency ranges for a given magnetic field and charge carrier density.

It should be stressed that all the topographies quoted for the shape of the edge, for the inhomogeneities of the edge or for the layout of the contacts are given purely by way of example and that an infinite number of other designs could be adopted.

Turning now to FIGS. 40 to 42 there are shown three illustrations of possible applications of the detector of the present invention.

First of all, FIG. 40 shows a security portal 110 at a security terminal of an airport, train or bus station. As illustrated in FIG. 40, there are three sources 112, 112'and 112" of electromagnetic radiation provided at one side of the portal, each having a horn or antenna 114, 114', 114" for radiating the electromagnetic radiation across the security portal. Opposite to each horn is a detector 116, 116', 116" in accordance with the present invention and all three detectors are connected to a computer schematically illustrated as 118. A lens 120 (or a waveguide or a horn (not shown)) can be used to direct the electromagnetic radiation passing across the portal 110 and through a person walking through the portal 110 onto the detectors 116, 116', 116". Each detector is designed so that it can analyze the radiation in different frequency ranges during the time a person walks through the security portal. Each of the sources of electromagnetic radiation produces a spectrum of different frequencies, which have an enlarged absorption in or a different transmission through the plastic explosives or plastic weapons that may be carried by the person walking through the security portal. Analyzing the spectrum of the received radiation, the computer will then be able to determine whether the person walking through the security portal carries the plastic explosives/weapons or not.

FIG. 41 shows the same basic idea applied to an apparatus for testing passengers' luggage, the same reference numerals being used to designate parts common to FIGS. 40 and 41. In this case the luggage is moved through a tunnel 121 on a conveyor belt and sources of electromagnetic radiation 112, 112', 112" are provided within the loop 122 of the conveyor belt 124 and emit the radiation through respective horns 114, 114', 114" upwardly towards respective detectors 116, 116', 116" provided adjacent the top of the tunnel. Again, the horns/antennas will emit electromagnetic radiation at frequencies which have an enlarged absorption in or a different transmission through the interested materials (for example plastic explosives or plastic weapons) and the detectors will be designed so that they can analyse the spectrum of the radiation received in corresponding frequency ranges, as explained above, so that all detectors can cover the entire frequency range or ranges of interest while a particular piece of luggage is passing beneath them. Of course there is no restriction to the detectors 116 being provided at the top of the tunnel 121 and the sources 112 of electromagnetic radiation within the loop of the conveyor belt. The sources of radiation 112 could be provided at the top of the tunnel 120 and the detectors 116 could be provided in the conveyor loop or the sources of electromagnetic radiation or the detectors 116 could be provided below the conveyor belt loop. Equally the sources and detectors could be provided at opposite sides of the tunnel. In all cases the computer 118 is able to analyze the frequency spectrum of the electromagnetic radiation transmitted through a piece of luggage 126 and to determine whether there is a likelihood of plastic explosives or plastic weapons being hidden in the piece of luggage being investigated.

Finally, FIG. 42 shows a system which is used to check for the presence of ill (for example cancerous) tissue. A tooth 128 in a gum 130 is shown and a source 112 of electromagnetic radiation is shown on one side of the tooth whereas a detector 116 for analysing the frequency spectrum of electromagnetic radiation transmitted through the investigated tissue is provided on the opposite side of the tooth. Again, since ill tissue (for example cancerous tissue) has a different absorption/transmission capability for electromagnetic radiation than healthy tissue, the system should be able to detect the tooth decay or cancerous growths in the gum. This is only one illustration of the application of the principle of detecting ill or cancerous tissue. Naturally, the apparatus can be modified to detect cancerous tissue anywhere in the body, for example in the brain, in the colon, or in a patient's breasts.

In medical applications the described principle of detection of electromagnetic radiation can even be used without sources of radiation in Gigahertz/Terahertz frequency bands. As the human body itself emits electromagnetic waves in the far-infrared range (Gigahertz and Terahertz frequency range), analyzing the spectrum of the emitted radiation and comparing the spectra emitted by a healthy person with the spectra emitted by an ill patient, one could determine, at early stages, the development of different illnesses as for example cancer or liver illnesses.

Detectors based on the described principle can also work in telecommunication applications.

What we claim is:

1. A detector for electromagnetic radiation comprising:
   a semiconductor structure having a first charge carrier layer selected from the group consisting of a 2D charge carrier layer and a quasi 2D charge carrier layer wherein said charge carrier layer has an edge;
   at least a first contact and a second contact to said first charge carrier layer, said first contact and said second contact being provided at said edge and being spaced apart by a distance;
   a device for measuring at least one property selected from the group consisting of the photocurrent between said first and second contacts, the photovoltage between said first and second contacts and the resistance between said first and second contacts;
   a device for applying a magnetic field to said detector with a field component perpendicular to said first charge carrier layer, an output signal of said device for measuring providing information about at least one property selected from the group consisting of the presence of electromagnetic radiation, the intensity of the incident electromagnetic radiation and the frequency of the incident electromagnetic radiation.

2. A detector in accordance with claim 1, said edge including a first projection and a second projection and wherein said first contact is provided at said first projection and said second contact is provided at said second projection.

3. A detector in accordance with claim 2, said first and second projections extending in a direction selected from a group consisting of extending outwardly from said edge of said first, charge carrier layer and extending inwardly from said edge of said first charge carrier layer.

4. A detector in accordance with claim 2, wherein said edge is substantially straight between said first projection and said second projection.

5. A detector in accordance with claim 2, wherein said edge has a shape differing from a straight line.

6. A detector in accordance with claim 5, wherein said shape includes one or more further projections between said first projection and said second projection.

7. A detector in accordance with claim 1, including means for varying the amplitude of the applied magnetic field, whereby to obtain information about the frequency of the incident electromagnetic radiation.

8. A detector in accordance with claim 1, including means for varying the charge carrier density in said charge carrier layer, whereby to obtain information about the frequency of the incident electromagnetic radiation.

9. A detector in accordance with claim 1, wherein one or more islands of a second charge carrier layer selected from the group consisting of a 2D charge carrier layer and of a quasi 2D charge carrier layer are provided wherein said one or more islands are distinct from said first charge carrier layer between said first contact and said second contact.

10. A detector in accordance with claim 1, wherein further contacts to said edge of said first charge carrier layer are provided in addition to said first contact and said second contact.

11. A detector in accordance with claim 1, wherein said semiconductor structure includes a plurality of discrete charge carrier layers wherein each of said plurality of discrete charge carrier layers is a charge carrier layer selected from the group consisting of a 2D charge carrier layer and a quasi 2D charge carrier layer and at least respective first and second contacts are provided to an edge of each of said plurality of discrete charge carrier layers, each of said plurality of discrete charge carrier layer being present in at least one plane.

12. A detector in accordance with claim 11, wherein the effective distance between said first contact and said second contact to each of said plurality of said discrete charge carrier layers is different for each of the different discrete charge carrier layers.

13. A detector in accordance with claim 1, wherein said 2D charge carrier layer is an electron layer.

14. A detector in accordance with claim 1, wherein said 2D charge carrier layer is a hole layer.

15. A detector in accordance with claim 1, wherein said semiconductor structure comprises a GaAs/AlGaAs heterostructure.

16. A detector in accordance with claim 1, wherein said semiconductor structure comprises one of a Si MOSFET structure, an InAs structure or a Si/Ge structure.

17. A detector in accordance with claim 1, wherein said first charge carrier layer is realized in the form of a single quantum well.

18. A detector in accordance with claim 1, wherein said first charge carrier layer is realized in the form of a double quantum well.

19. A detector in accordance with claim 1, wherein said first charge carrier layer is realized in the form of a superlattice containing multiple quantum wells.

20. A detector in accordance with claim 1, wherein said first charge carrier layer is realized in the form of a heterojunction.

21. A detector in accordance with claim 1, wherein said first contact and said second contact are provided to said first charge carrier layer and said edge is realized without intentionally introduced inhomogeneities.

22. A detector in accordance with claim 1, wherein multiple pairs of first and second contacts are provided to said first charge carrier layer and said edge is realized without intentionally introduced inhomogeneities.

23. A detector in accordance with claim 1 having said first contact and said second contact wherein said edge is realized with intentionally introduced at least one inhomogeneities of arbitrary shape.

24. A detector in accordance with claim 23, wherein a plurality of inhomogeneities of said edge are arranged periodically along said edge.

25. A detector in accordance with claim 23, wherein a plurality of inhomogeneities of said edge are arranged non-periodically along said edge.

26. A detector in accordance with claim 1 having a plurality of pairs of a first potential contact and a second potential contact to said charge carrier layer and wherein said edge is realized with intentionally introduced at least one inhomogeneities of arbitrary shape.

27. A detector in accordance with claim 26, wherein multiple inhomogeneities of said edge are arranged periodically along said edge.

28. A detector in accordance with claim 26, wherein multiple inhomogeneities of said edge are arranged non-periodically along said edge.

29. A detector in accordance with claim 1, wherein a third contact and a fourth contact are provided to said first charge carrier layer in addition to said first and second contacts and means is provided for directing a current between said third contact and said fourth contact through said first charge carrier layer.

30. A detector in accordance with claim 29, wherein said first charge carrier layer is fabricated in the shape of a Hall bar.

31. A detector in accordance with claim 1, wherein said first charge carrier layer has the shape of a circular disk.

32. A detector in accordance with claim 31, wherein said circular disk has an edge and at least a first projection and a second projection are provided at said edge with said first contact and said second contact being provided to said first projection and said second projection.

33. A detector in accordance with claim 31, wherein said circular disk has an edge and at least a first indentation and a second indentation are provided at said edge, with said first contact being provided at said first indentation and said second contact being provided at said second indentation.

34. A detector in accordance with claim 31, wherein said circular disk has an edge having at least one projection and at least one indentation and wherein said first contact and said second contact are provided to said at least one projection and to said at least one indentation respectively.

35. A detector in accordance with claim 31, wherein said first charge carrier layer is fabricated in the shape of a Corbino disk having inner and outer edges.

36. A detector in accordance with claim 35, wherein at least a first projection and a second projection provided at one of said edges with said first contact being provided at said first projection and said second contact being provided at said second projection.

37. A detector in accordance with claim 35, wherein at least a first indentation and a second indentation are provided on at least one of said edges, with said first contact being provided on said first indentation and said second contact being provided at said second indentation.

38. A detector in accordance with claim 35, wherein at least one projection and at least one indentation are provided on at least one of said edges and wherein said first contact is provided on said projection and said second contact is provided on said at least one indentation respectively.

39. A detector in accordance with claim 1, wherein said first charge carrier layer has an aperture and said edge is an edge of said aperture.

40. A detector in accordance with claim 1 further comprising a plurality of detectors provided on one chip.

41. A detector in accordance with claim 1 in combination with at least one device selected from the group consisting of a lens, a horn and a waveguide for directing electromagnetic radiation onto said detector.

42. A detector in accordance with claim 1, including means for cooling said detector to a temperature between ambient temperature and the boiling point of liquid nitrogen or other cryogenic fluids.

43. A method of detecting electromagnetic radiation comprising the steps of:
exposing a carrier layer selected from a group consisting of a 2D charge carrier layer and a quasi 2D charge carrier layer to a magnetic field having at least a component perpendicular to said carrier layer and to electromagnetic radiation having at least an electric field component parallel to the said charge carrier layer, thereby causing the excitation of edge magnetoplasmons in the presence of said electromagnetic radiation,
detecting the excitation of said edge magnetoplasmons by reference to a measurement of a property selected from a group consisting of a photovoltage, a photocurrent and a resistance related thereto and forming a result and evaluating said result of said measurement to obtain information about said electromagnetic radiation.

44. A method in accordance with claim 43, wherein said detector comprises:
a semiconductor structure having a first charge carrier layer selected from the group consisting of a 2D charge carrier layer and a quasi 2D charge carrier layer wherein said charge carrier layer has an edge:
at least a first contact and a second contact to said first charge carrier layer, said first contact and said second contact being provided at said edge and being spaced apart by a distance;
a device for measuring at least one property selected from the group consisting of the photocurrent between said first and second contacts, the photovoltage between said first and second contacts and the resistance between said first and second contacts; and
a device for applying a magnetic field to said detector with a field component perpendicular to said first charge carrier layer, an output signal of said device for measuring providing information about at least one property selected from the group consisting of the presence of electromagnetic radiation, the intensity of the incident electromagnetic radiation and the frequency of the incident electromagnetic radiation.

45. A method in accordance with claim 43, including the step of varying the amplitude of the applied magnetic field and deducing information about the frequency of the incident electromagnetic radiation from said photovoltage, said photocurrent or said resistance.

46. A method in accordance with claim 43 and comprising the further step of varying the charge carrier density in said charge carrier layer to obtain information about a property selected from a group consisting of the frequency of the incident electromagnetic radiation from said photovoltage, said photocurrent or said resistance.

47. A method of detecting the intensity and the frequency of electromagnetic radiation comprising:
receiving said electromagnetic radiation;
transforming the energy of said electromagnetic radiation to the energy of edge magnetoplasmons with the same frequency, propagating along a boundary of a 2D charged system embodied in a device between first and second potential contacts to said boundary;
rectification of the resulting oscillating edge-magnetoplasmon electric field inside the device by non-linear behavior in the device or in said potential contacts;
detecting a resulting change in resistance between said potential contacts for measuring the amplitude of the incident electromagnetic radiation; and
detecting the period of oscillations of an induced dc photovoltage between pairs of potential contacts, as a function of the applied magnetic field B, for measuring the frequency of the incident electromagnetic radiation.

48. A method of detecting the intensity and the frequency of electromagnetic radiation comprising:
receiving said electromagnetic radiation;
transforming the energy of said electromagnetic radiation to the energy of edge magnetoplasmons with the same frequency, propagating along a boundary of a 2D charged system embedded in a device between the first and second potential contacts to said boundary;
rectification of the resulting oscillating edge-magnetoplasmon electric field inside the device by non-linear behavior in the device or in said potential contacts;
detecting a resulting change in photocurrent between said potential contacts for measuring the amplitude of the incident electromagnetic radiation; and
detecting the period of oscillations of an induced dc photovoltage between pairs of potential contacts, as a function of the applied magnetic field B, for measuring the frequency of the incident electromagnetic radiation.

49. A method of detecting the intensity and the frequency of electromagnetic radiation comprising:
receiving said electromagnetic radiation;
transforming the energy of said electromagnetic radiation to the energy of edge magnetoplasmons with the same frequency, propagating along a boundary of a 2D charged system embedded in a device between the first and second potential contacts to said boundary;
rectification of the resulting oscillating edge-magnetoplasmon electric field inside the device by non-linear behavior in the device or in said potential contacts;
detecting a resulting change in photocurrent between said potential contacts for measuring the amplitude of the incident electromagnetic radiation; and
detecting the period of oscillations of the said photocurrent between pairs of potential contacts, as a function of the applied magnetic field B, for measuring the frequency of the incident electromagnetic radiation.

* * * * *